US012660654B2

(12) United States Patent
Weng et al.

(10) Patent No.: US 12,660,654 B2
(45) Date of Patent: Jun. 16, 2026

(54) INTEGRATED FAN-OUT PACKAGE AND MANUFACTURING METHOD THEREOF

(71) Applicant: Taiwan Semiconductor Manufacturing Company, Ltd., Hsinchu (TW)

(72) Inventors: Chung-Ming Weng, Taichung City (TW); Tzu-Sung Huang, Tainan City (TW); Wei-Kang Hsieh, Tainan City (TW); Hao-Yi Tsai, Hsinchu City (TW); Ming-Hung Tseng, Miaoli County (TW); Tsung-Hsien Chiang, Hsinchu (TW); Yen-Liang Lin, Taichung City (TW); Chu-Chun Chueh, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 643 days.

(21) Appl. No.: 18/166,450

(22) Filed: Feb. 8, 2023

(65) Prior Publication Data

US 2024/0178120 A1      May 30, 2024

Related U.S. Application Data

(60) Provisional application No. 63/428,121, filed on Nov. 28, 2022.

(51) Int. Cl.
*H10W 70/65* (2026.01)
*H10W 46/00* (2026.01)
(Continued)

(52) U.S. Cl.
CPC ........... *H10W 70/65* (2026.01); *H10W 46/00* (2026.01); *H10W 70/05* (2026.01);
(Continued)

(58) Field of Classification Search
CPC ........... H01L 23/5389; H01L 23/49838; H01L 21/4857; H01L 24/24; H01L 24/82;
(Continued)

(56) References Cited

U.S. PATENT DOCUMENTS 8,987,922 B2 3/2015 Yu et al.
9,196,532 B2 11/2015 Tu et al.
(Continued)

*Primary Examiner* — Evan G Clinton
(74) *Attorney, Agent, or Firm* — JCIPRNET

(57) ABSTRACT

An integrated fan-out package includes a first redistribution structure, a die, conductive structures, an encapsulant, and a second redistribution structure. The first redistribution structure has first regions and a second region surrounding the first regions. A metal density in the first regions is smaller than a metal density in the second region. The die is disposed over the first redistribution structure. The conductive structures are disposed on the first redistribution structure to surround the die. Vertical projections of the conductive structures onto the first redistribution structure fall within the first regions of the first redistribution structure. The encapsulant encapsulates the die and the conductive structures. The second redistribution structure is disposed on the encapsulant, the die, and the conductive structures.

20 Claims, 19 Drawing Sheets

(51) Int. Cl.

| | |
|---|---|
| *H10W 70/05* | (2026.01) |
| *H10W 74/01* | (2026.01) |
| *H10W 74/10* | (2026.01) |
| *H10W 90/00* | (2026.01) |
| *H10W 70/00* | (2026.01) |
| *H10W 70/652* | (2026.01) |
| *H10W 70/685* | (2026.01) |
| *H10W 72/00* | (2026.01) |

(52) U.S. Cl.

CPC ........ *H10W 74/019* (2026.01); *H10W 74/117* (2026.01); *H10W 90/00* (2026.01); *H10W 46/401* (2026.01); *H10W 70/093* (2026.01); *H10W 70/099* (2026.01); *H10W 70/6528* (2026.01); *H10W 70/685* (2026.01); *H10W 72/073* (2026.01); *H10W 72/07307* (2026.01); *H10W 72/874* (2026.01); *H10W 90/734* (2026.01)

(58) Field of Classification Search

CPC . H01L 23/49822; H01L 24/20; H01L 23/544; H01L 2223/54433; H01L 23/5381; H10W 70/65; H10W 70/05; H10W 90/00; H10W 70/099; H10W 70/6528

See application file for complete search history.

(56) References Cited

U.S. PATENT DOCUMENTS

| | | | |
|---|---|---|---|
| 9,196,559 B2 | 11/2015 | Tsai et al. | |
| 9,257,333 B2 | 2/2016 | Lu et al. | |
| 9,263,839 B2 | 2/2016 | Chen et al. | |
| 9,275,924 B2 | 3/2016 | Wang et al. | |
| 9,275,925 B2 | 3/2016 | Chen et al. | |
| 9,281,254 B2 | 3/2016 | Yu et al. | |
| 9,372,206 B2 | 6/2016 | Wu et al. | |
| 9,496,189 B2 | 11/2016 | Yu et al. | |
| 2018/0301389 A1* | 10/2018 | Liu | H01L 25/105 |
| 2019/0385951 A1* | 12/2019 | Chu | H01L 23/5383 |
| 2021/0125936 A1* | 4/2021 | Wang | H01L 21/6835 |
| 2022/0238445 A1* | 7/2022 | Olson | H01L 25/50 |

* cited by examiner

110

C

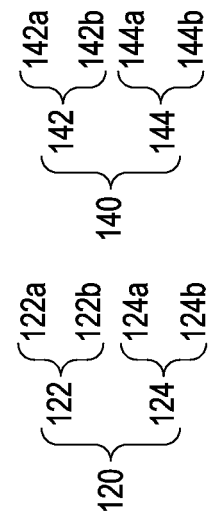
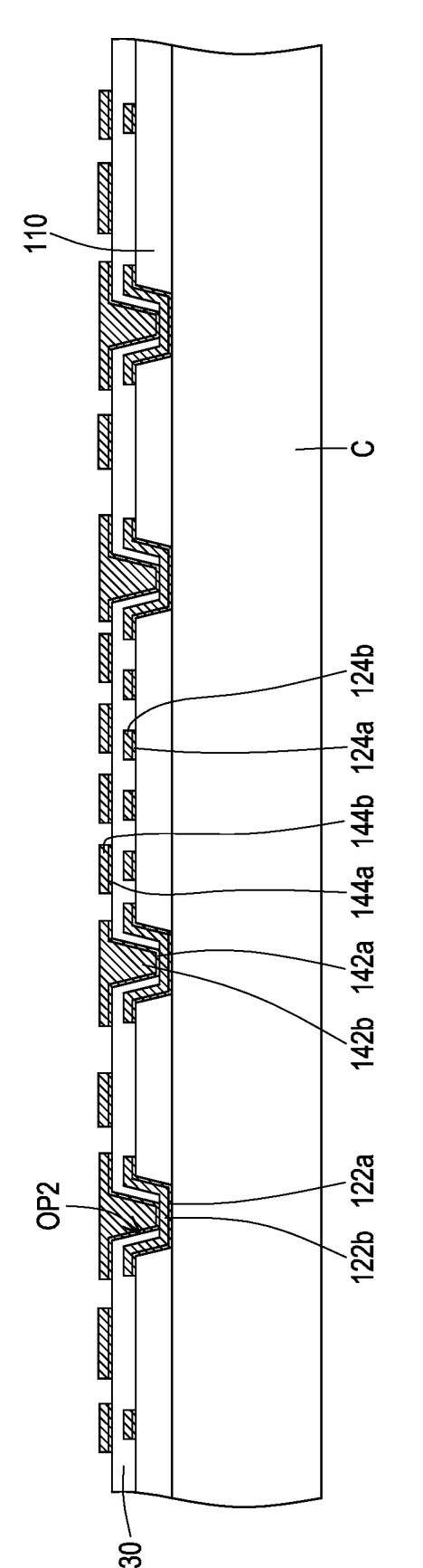
FIG. 1D

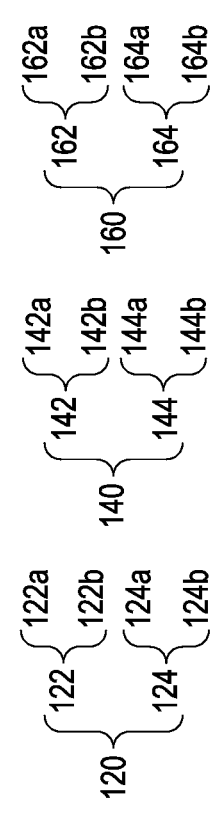
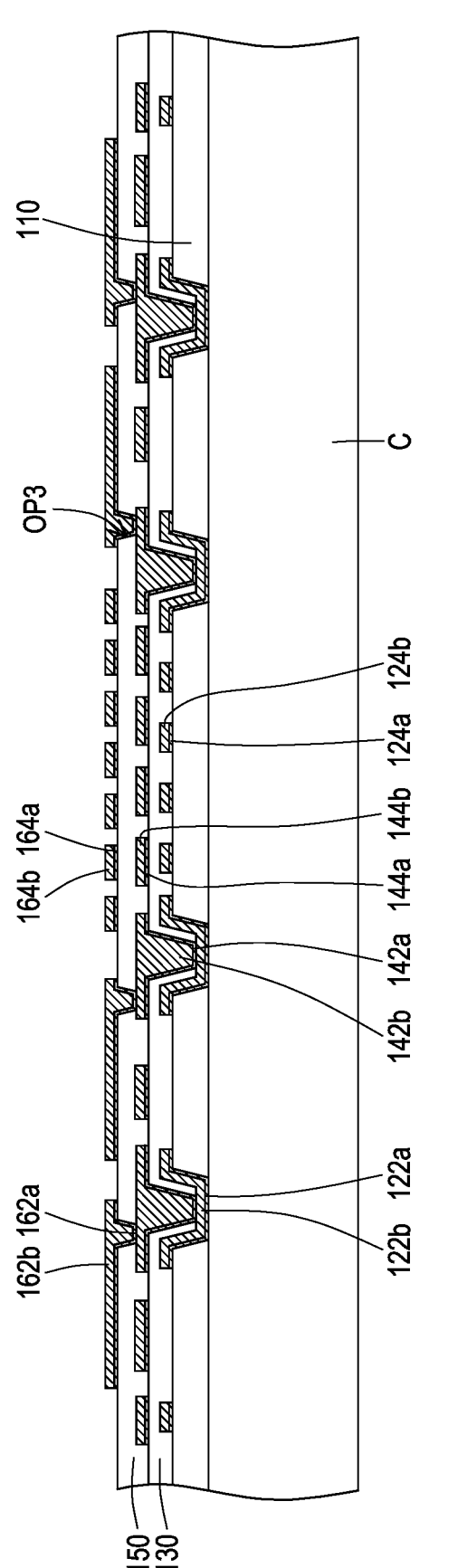
FIG. 1F

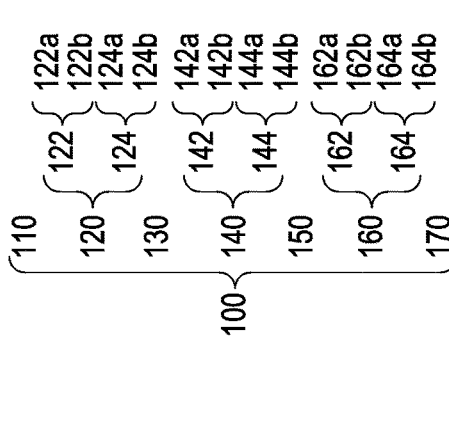
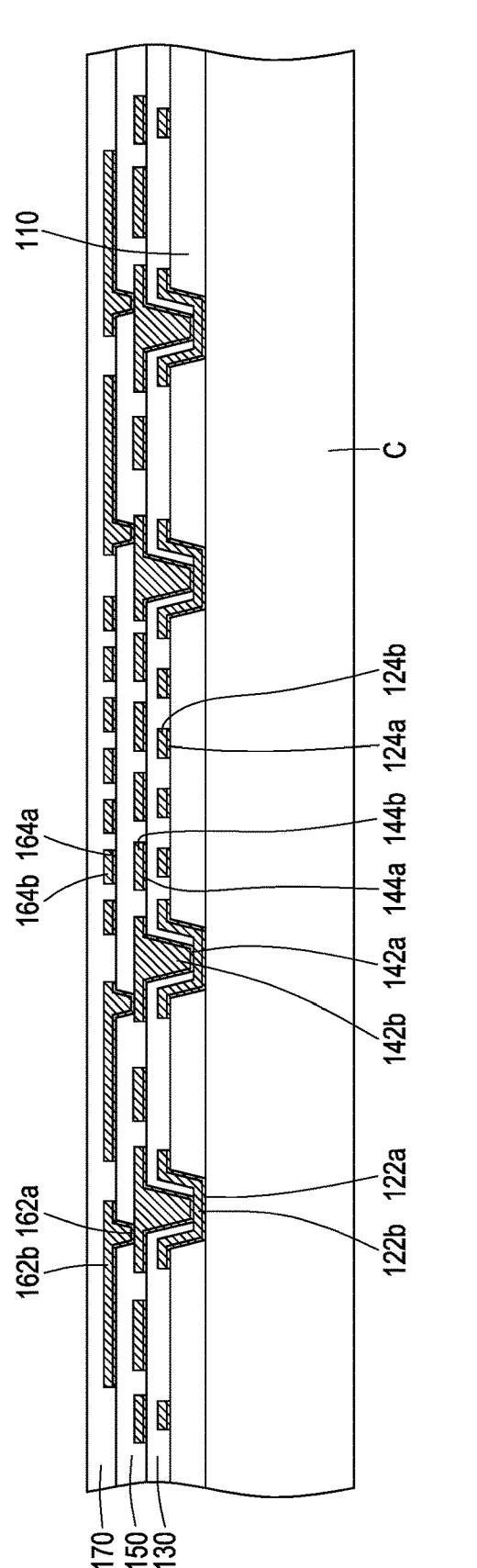
FIG. 1G

INTEGRATED FAN-OUT PACKAGE AND MANUFACTURING METHOD THEREOF

CROSS-REFERENCE TO RELATED APPLICATION

This application claims the priority benefit of U.S. provisional application Ser. No. 63/428,121, filed on Nov. 28, 2022. The entirety of the above-mentioned patent application is hereby incorporated by reference herein and made a part of this specification.

BACKGROUND

The semiconductor industry has experienced rapid growth due to continuous improvements in the integration density of various electronic components (i.e., transistors, diodes, resistors, capacitors, etc.). For the most part, the improvement in integration density has come from repeated reductions in minimum feature size, which allows more of the smaller components to be integrated into a given area. These smaller electronic components also require smaller packages that utilize less area than previous packages. Currently, integrated fan-out packages are becoming increasingly popular for their compactness. In the integrated fan-out packages, formation of the redistribution structure plays an important role during packaging process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
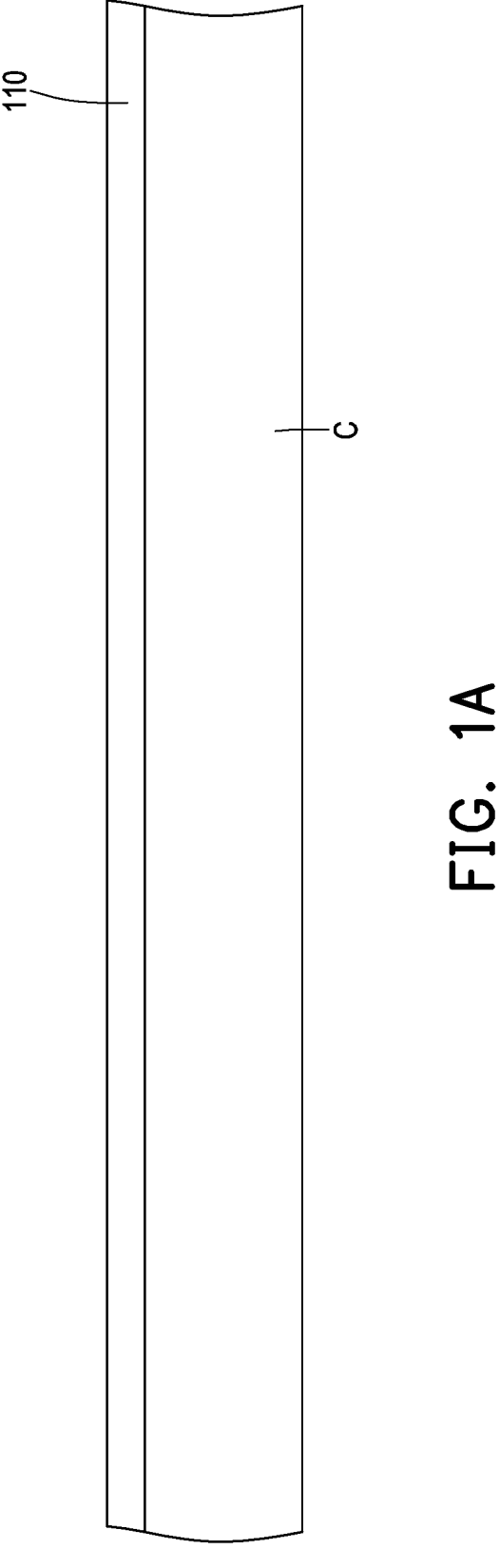
FIG. 1A to FIG. 1O are schematic cross-sectional views illustrating a manufacturing process of an integrated fan-out package in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1O are schematic cross-sectional views illustrating a manufacturing process of an integrated fan-out package 10 in accordance with some embodiments of the disclosure. Referring to FIG. 1A, a carrier C is provided. In some embodiments, the carrier C is made of silicon, polymer, polymer composite, metal foil, ceramic, glass, glass epoxy, tape, or other suitable material for structural support. Thereafter, a marking layer 110 is formed on the carrier C. In some embodiments, an adhesive layer (not shown) is formed between the carrier C and the marking layer 110. The adhesive layer may be detached from the carrier C by, e.g., shining a ultra-violet (UV) light on the carrier C in a subsequent carrier de-bonding process. For example, the adhesive layer is a light-to-heat-conversion (LTHC) coating layer or the like.

In some embodiments, a material of the marking layer 110 includes polyimide, epoxy resin, acrylic resin, phenol resin, benzocyclobutene (BCB), polybenzoxazole (PBO), or any other suitable polymer-based dielectric material. Alternatively, the marking layer 110 may be formed of oxides or nitrides, such as silicon oxide, silicon nitride, aluminum oxide, hafnium oxide, hafnium zirconium oxide, or the like. In some embodiments, the marking layer 110 includes resin mixed with filler. The marking layer 110 may be formed by suitable fabrication techniques, such as spin-on coating, chemical vapor deposition (CVD), plasma-enhanced chemical vapor deposition (PECVD), or the like.

Figure 1B:
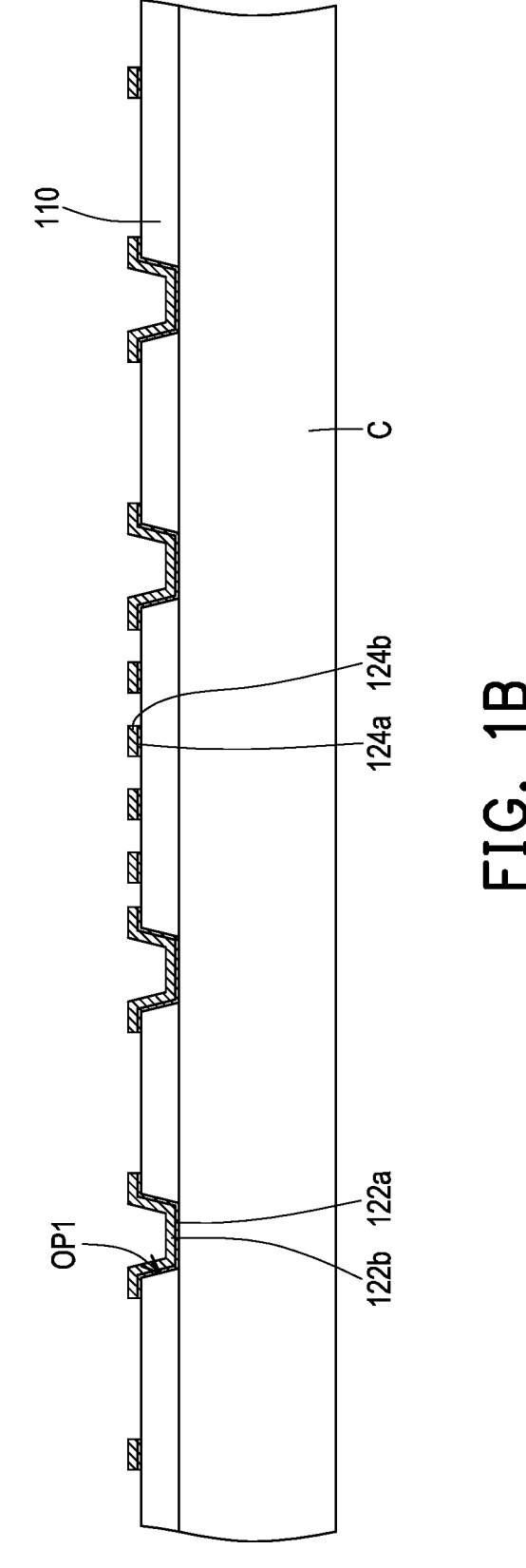

Referring to FIG. 1B, a first conductive layer 120 is formed on the marking layer 110. In some embodiments, the first conductive layer 120 is formed by the following steps. First, a plurality of openings OP1 is formed in the marking layer 110. In some embodiments, each of the openings OP1 penetrate through the marking layer 110 to expose the underlying carrier C or the underlying adhesive layer (if present). Thereafter, a seed material layer (not shown) is conformally formed on the marking layer 110. For example, at least a portion of the seed material layer extends into the openings OP1 of the marking layer 110 to be in physical contact with the carrier C or the adhesive layer (if present). In some embodiments, the seed material layer is formed through a sputtering process, a physical vapor deposition (PVD) process, or the like. In some embodiments, the seed material layer is constituted by two sub-layers. The first sub-layer may include titanium, titanium nitride, tantalum, tantalum nitride, other suitable materials, or a combination thereof. On the other hand, the second sub-layer may include copper, copper alloys, or other suitable choice of materials. After the seed material layer is conformally formed on the marking layer 110, a patterned photoresist layer (not shown) is formed over the seed material layer. In some embodiments, the patterned photoresist layer is made of a photosensitive material. In some embodiments, the patterned photoresist layer has a plurality of openings that correspond to locations of the first conductive layer 120 to be formed. Subsequently, the openings of the patterned photoresist layer are filled with a conductive material. In some embodiments, the conductive material includes copper, copper alloys, or the like. The conductive material is formed by electroplating, deposition, or the like. After the openings are filled with the conductive material, the patterned photoresist layer and the seed material layer underneath the patterned photoresist layer are removed though an ashing or a stripping process, so as to form the first conductive layer 120 on the marking layer 110.

In some embodiments, the first conductive layer 120 includes a plurality of under-ball metallurgy (UBM) patterns 122 and a plurality of dummy patterns 124. In some embodiments, each of the UBM patterns 122 includes a seed layer 122a and a conductive layer 122b disposed on the seed layer 122a. Similarly, each of the dummy patterns 124 includes a seed layer 124a and a conductive layer 124b disposed on the seed layer 124a. For example, the remaining seed material layer described above constitutes the seed layer 122a and the seed layer 124a while the conductive material described above constitutes the conductive layer 122b and the conductive layer 124b. In some embodiments, the UBM patterns 122 extend into the opening OP1. For example, the UBM patterns 122 penetrate through the marking layer 110 to be in physical contact with the carrier C or the adhesive layer (if present). That is, the seed layer 122a of the UBM patterns 122 is in physical contact with the carrier C or the adhesive layer (if present). In some embodiments, the dummy patterns 124 are located on a top surface of the marking layer 110. For example, the dummy patterns 124 are separated from the carrier C by the marking layer 110. In some embodiments, the dummy patterns 124 are electrically floating. That is, the dummy patterns 124 are not electrically connected to other conductive elements in the subsequently formed integrated fan-out package 10 and do not contribute to signal transmission during the operation of the subsequently formed integrated fan-out package 10. In some embodiments, the dummy patterns 124 form a mesh structure in a top view (shown in FIG. 2A to FIG. 2C).

As illustrated in FIG. 1B, the UBM patterns 122 are spatially separated from the dummy patterns 124. For example, the UBM patterns 122 are electrically isolated from the dummy patterns 124. In some embodiments, the dummy patterns 124 and a portion of each of the UBM patterns 122 are located at a same level height. That is, the dummy patterns 124 and a portion of each of the UBM patterns 122 are both located on the top surface of the marking layer 110.

Figure 1C:
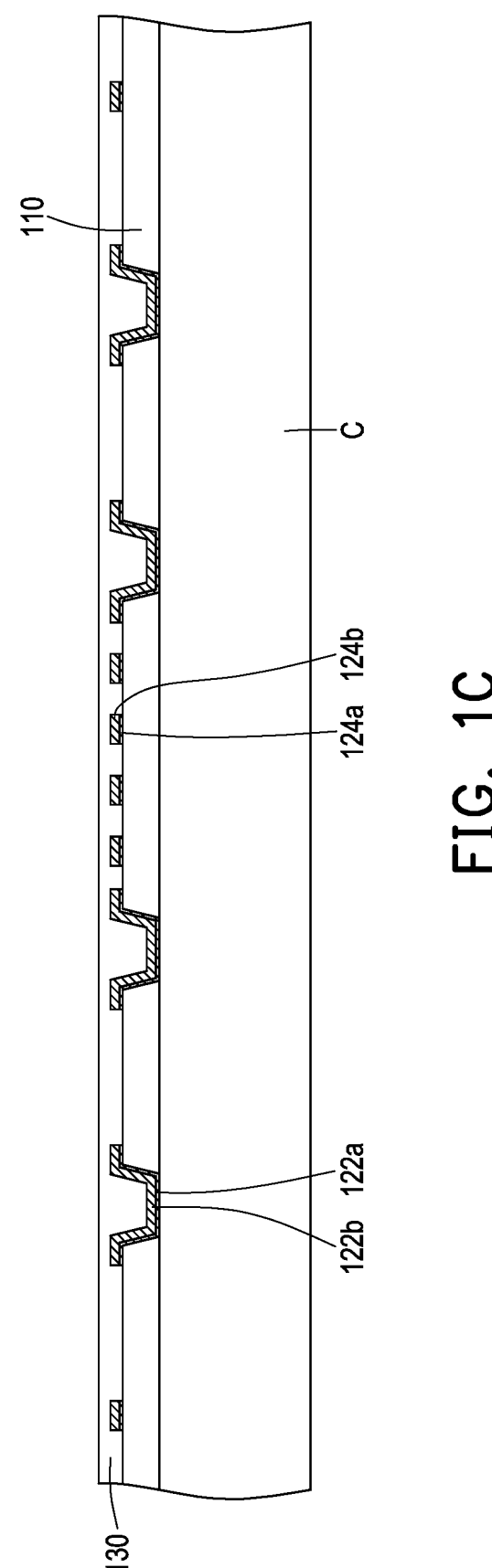

Referring to FIG. 1C, a first dielectric layer 130 is formed on the marking layer 110 and the first conductive layer 120. For example, the first dielectric layer 130 covers the marking layer 110, the UBM patterns 122, and the dummy patterns 124. In some embodiments, a material of the first dielectric layer 130 is the same as the material of the marking layer 110. However, the disclosure is not limited thereto. In some alternative embodiments, the material of the first dielectric layer 130 is different from the material of the marking layer 110. In some embodiments, the material of the first dielectric layer 130 includes polyimide, epoxy resin, acrylic resin, phenol resin, BCB, PBO, or any other suitable polymer-based dielectric material. Alternatively, the first dielectric layer 130 may be formed of oxides or nitrides, such as silicon oxide, silicon nitride, aluminum oxide, hafnium oxide, hafnium zirconium oxide, or the like. In some embodiments, the first dielectric layer 130 includes resin mixed with filler. The first dielectric layer 130 may be formed by suitable fabrication techniques, such as spin-on coating, CVD, PECVD, or the like.

Referring to FIG. 1D, a second conductive layer 140 is formed on the first dielectric layer 130 and the first conductive layer 120. In some embodiments, the second conductive layer 140 is formed by the following steps. First, a plurality of openings OP2 is formed in the first dielectric layer 130. In some embodiments, each of the openings OP2 penetrate through the first dielectric layer 130 to partially expose the underlying UBM patterns 122 of the first conductive layer 120. Thereafter, a seed material layer (not shown) is conformally formed on the first dielectric layer 130. For example, at least a portion of the seed material layer extends into the openings OP2 of the first dielectric layer 130 to be in physical contact with the UBM patterns 122 of the first conductive layer 120. In some embodiments, the seed material layer is formed through a sputtering process, a PVD process, or the like. In some embodiments, the seed material layer is constituted by two sub-layers. The first sub-layer may include titanium, titanium nitride, tantalum, tantalum nitride, other suitable materials, or a combination thereof. On the other hand, the second sub-layer may include copper, copper alloys, or other suitable choice of materials. After the seed material layer is conformally formed on the first dielectric layer 130, a patterned photoresist layer (not shown) is formed over the seed material layer. In some embodiments, the patterned photoresist layer is made of a photosensitive material. In some embodiments, the patterned photoresist layer has a plurality of openings that correspond to locations of the second conductive layer 140 to be formed. Subsequently, the openings of the patterned photoresist layer are filled with a conductive material. In some embodiments, the conductive material includes copper, copper alloys, or the like. The conductive material is formed by electroplating, deposition, or the like. After the openings are filled with the conductive material, the patterned photoresist layer and the seed material layer underneath the patterned photoresist layer are removed though an ashing or a stripping process, so as to form the second conductive layer 140 on the first conductive layer 120 and the first dielectric layer 130.

In some embodiments, the second conductive layer 140 includes a plurality of connecting patterns 142 and a plurality of routing patterns 144. In some embodiments, each of the connecting patterns 142 includes a seed layer 142a and a conductive layer 142b disposed on the seed layer 142a. Similarly, each of the routing patterns 144 includes a seed layer 144a and a conductive layer 144b disposed on the seed layer 144a. For example, the remaining seed material layer described above constitutes the seed layer 142a and the seed layer 144a while the conductive material described above constitutes the conductive layer 142b and the conductive layer 144b. In some embodiments, the connecting patterns 142 extend into the opening OP2. For example, the connecting patterns 142 penetrate through the first dielectric layer 130 to be in physical contact with the UBM patterns 122. That is, the seed layer 142a of the connecting patterns 142 is in physical contact with the conductive layer 122b of the UBM patterns 122 such that the second conductive layer 140 is electrically connected to the first conductive layer 120. In some embodiments, the routing patterns 144 are located on a top surface of the first dielectric layer 130. For example, the routing patterns 144 are separated from the marking layer 110 by the first dielectric layer 130. In some embodiments, the routing patterns 144 are electrically connected to the connecting patterns 142. For example, the connecting patterns 142 transmit signals vertically while the routing patterns 144 transmit signals horizontally. In some embodiments, the routing patterns 144 and a portion of each of the connecting patterns 142 are located at a same level height. That is, the routing patterns 144 and a portion of each of the connecting patterns 142 are both located on the top surface of the first dielectric layer 130.

Figure 1E:
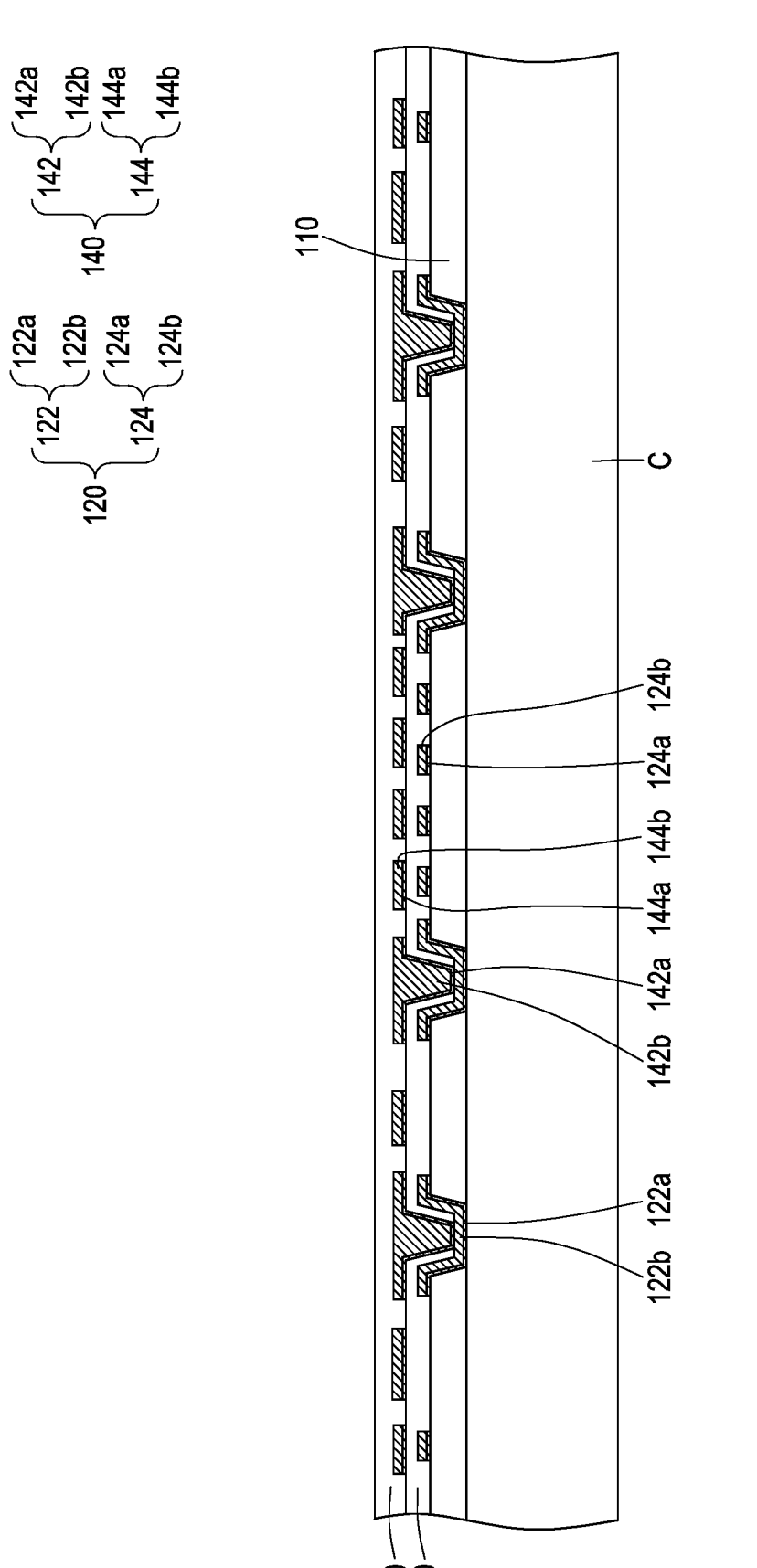

Referring to FIG. 1E, a second dielectric layer 150 is formed on the first dielectric layer 130 and the second conductive layer 140. For example, the second dielectric layer 150 covers the first dielectric layer 130, the connecting patterns 142, and the routing patterns 144. In some embodiments, a material of the second dielectric layer 150 is the same as the material of the marking layer 110 and the first dielectric layer 130. However, the disclosure is not limited thereto. In some alternative embodiments, the material of the second dielectric layer 150 is different from the material of the marking layer 110 and the first dielectric layer 130. In some embodiments, the material of the second dielectric layer 150 includes polyimide, epoxy resin, acrylic resin, phenol resin, BCB, PBO, or any other suitable polymer-based dielectric material. Alternatively, the second dielectric layer 150 may be formed of oxides or nitrides, such as silicon oxide, silicon nitride, aluminum oxide, hafnium oxide, hafnium zirconium oxide, or the like. In some embodiments, the second dielectric layer 150 includes resin mixed with filler. The second dielectric layer 150 may be formed by suitable fabrication techniques, such as spin-on coating, CVD, PECVD, or the like.

Referring to FIG. 1F, a third conductive layer 160 is formed on the second dielectric layer 150 and the second conductive layer 140. In some embodiments, the third conductive layer 160 is formed by the following steps. First, a plurality of openings OP3 is formed in the second dielectric layer 150. In some embodiments, each of the openings OP3 penetrate through the second dielectric layer 150 to partially expose the underlying connecting patterns 142 and/or the routing patterns 144 of the second conductive layer 140. Thereafter, a seed material layer (not shown) is conformally formed on the second dielectric layer 150. For example, at least a portion of the seed material layer extends into the openings OP3 of the second dielectric layer 150 to be in physical contact with the connecting patterns 142 and/or the routing patterns 144 of the second conductive layer 140. In some embodiments, the seed material layer is formed through a sputtering process, a PVD process, or the like. In some embodiments, the seed material layer is constituted by two sub-layers. The first sub-layer may include titanium, titanium nitride, tantalum, tantalum nitride, other suitable materials, or a combination thereof. On the other hand, the second sub-layer may include copper, copper alloys, or other suitable choice of materials. After the seed material layer is conformally formed on the second dielectric layer 150, a patterned photoresist layer (not shown) is formed over the seed material layer. In some embodiments, the patterned photoresist layer is made of a photosensitive material. In some embodiments, the patterned photoresist layer has a plurality of openings that correspond to locations of the third conductive layer 160 to be formed. Subsequently, the openings of the patterned photoresist layer are filled with a conductive material. In some embodiments, the conductive material includes copper, copper alloys, or the like. The conductive material is formed by electroplating, deposition, or the like. After the openings are filled with the conductive material, the patterned photoresist layer and the seed material layer underneath the patterned photoresist layer are removed though an ashing or a stripping process, so as to form the third conductive layer 160 on the second conductive layer 140 and the second dielectric layer 150.

In some embodiments, the third conductive layer 160 includes a plurality of connecting patterns 162 and a plurality of routing patterns 164. In some embodiments, each of the connecting patterns 162 includes a seed layer 162a and a conductive layer 162b disposed on the seed layer 162a. Similarly, each of the routing patterns 164 includes a seed layer 164a and a conductive layer 164b disposed on the seed layer 164a. For example, the remaining seed material layer described above constitutes the seed layer 162a and the seed layer 164a while the conductive material described above constitutes the conductive layer 162b and the conductive layer 164b. In some embodiments, the connecting patterns 162 extend into the opening OP3. For example, the connecting patterns 162 penetrate through the second dielectric layer 150 to be in physical contact with the connecting patterns 144 and/or the routing patterns 144. That is, the seed layer 162a of the connecting patterns 162 is in physical contact with the conductive layer 142b of the connecting patterns 142 and/or the conductive layer 144b of the routing patterns 144 such that the third conductive layer 160 is electrically connected to the second conductive layer 140. In some embodiments, the routing patterns 164 are located on a top surface of the second dielectric layer 150. For example, the routing patterns 164 are separated from the first dielectric layer 130 by the second dielectric layer 150. In some embodiments, the routing patterns 164 are electrically connected to the connecting patterns 162. For example, the connecting patterns 162 transmit signals vertically while the routing patterns 164 transmit signals horizontally. In some embodiments, the routing patterns 164 and a portion of each of the connecting patterns 162 are located at a same level height. That is, the routing patterns 164 and a portion of each of the connecting patterns 162 are both located on the top surface of the second dielectric layer 150.

Referring to FIG. 1G, a third dielectric layer 170 is formed on the second dielectric layer 150 and the third conductive layer 160. For example, the third dielectric layer 170 covers the second dielectric layer 150, the connecting patterns 162, and the routing patterns 164. In some embodiments, a material of the third dielectric layer 170 is the same as the material of the marking layer 110, the first dielectric layer 130, and the second dielectric layer 150. However, the disclosure is not limited thereto. In some alternative embodiments, the material of the third dielectric layer 170 is different from the material of the marking layer 110, the first dielectric layer 130, and the second dielectric layer 150. In some embodiments, the material of the third dielectric layer 170 includes polyimide, epoxy resin, acrylic resin, phenol resin, BCB, PBO, or any other suitable polymer-based dielectric material. Alternatively, the third dielectric layer 170 may be formed of oxides or nitrides, such as silicon oxide, silicon nitride, aluminum oxide, hafnium oxide, hafnium zirconium oxide, or the like. In some embodiments, the third dielectric layer 170 includes resin mixed with filler. The third dielectric layer 170 may be formed by suitable fabrication techniques, such as spin-on coating, CVD, PECVD, or the like.

In some embodiments, the marking layer 110, the first conductive layer 120, the first dielectric layer 130, the second conductive layer 140, the second dielectric layer 150, the third conductive layer 160, and the third dielectric layer 170 are collectively referred to as a first redistribution structure 100. That is, the first redistribution structure 100 is formed on the carrier C.

Figure 1H:
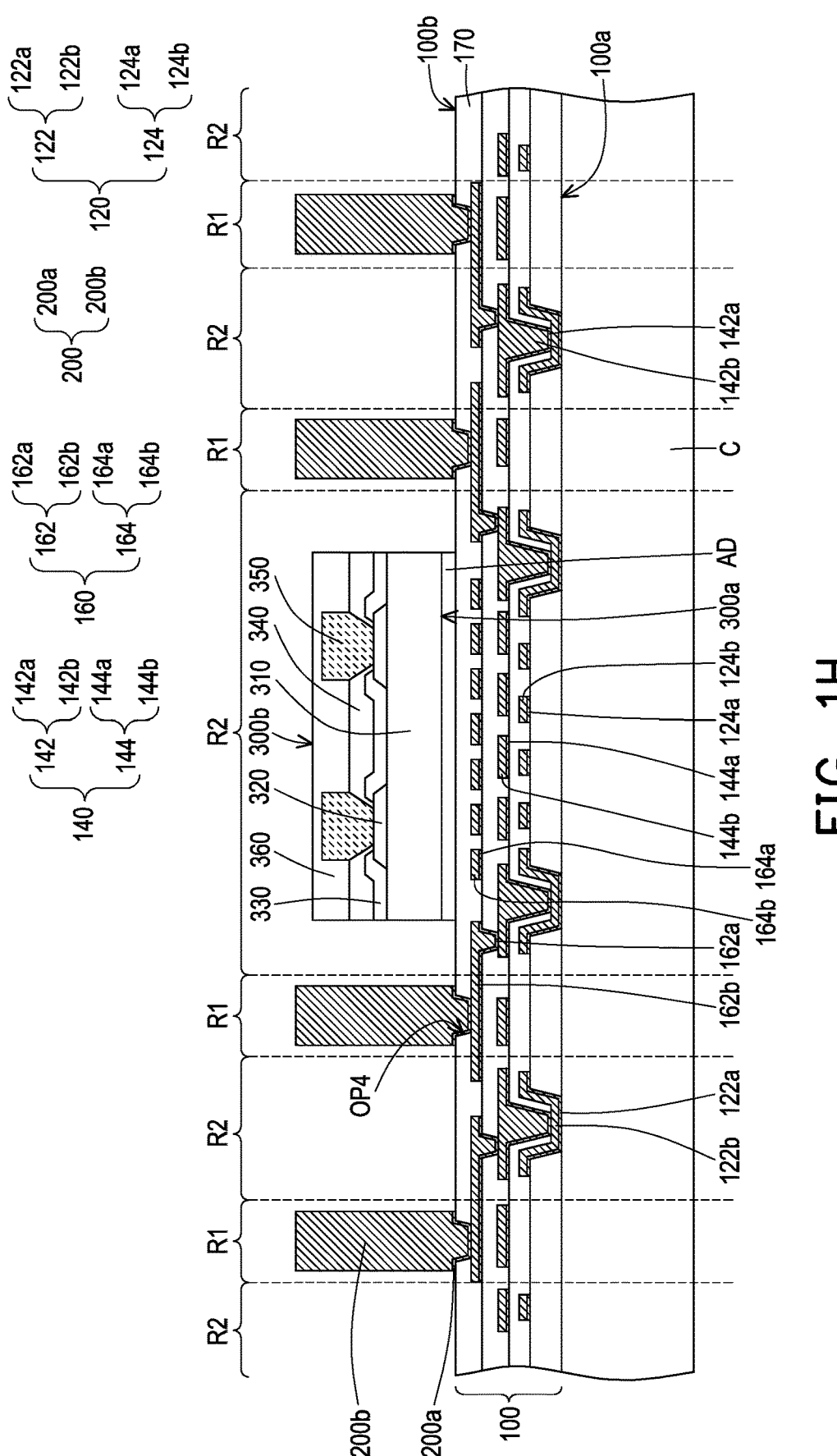

Referring to FIG. 1H, a plurality of conductive structures 200 and a die 300 are formed over the first redistribution structure 100. In some embodiments, the first redistribution structure 100 has a first surface 100a and a second surface 100b opposite to the first surface 100a. In some embodiments, the first surface 100a of the first redistribution structure 100 faces the carrier C. For example, the UBM patterns 122 are located at the first surface 100a. Meanwhile, the conductive structures 200 and the die 300 are formed over the second surface 100b of the first redistribution structure 100.

In some embodiments, the conductive structures 200 are formed by the following steps. First, a plurality of openings OP4 is formed in the third dielectric layer 170. In some embodiments, each of the openings OP4 penetrate through the third dielectric layer 170 to partially expose the underlying connecting patterns 162 and/or the routing patterns 164 of the third conductive layer 160. Thereafter, a seed material layer (not shown) is conformally formed on the third dielectric layer 170. For example, at least a portion of the seed material layer extends into the openings OP4 of the third dielectric layer 170 to be in physical contact with the connecting patterns 162 and/or the routing patterns 164 of the third conductive layer 160. In some embodiments, the seed material layer is formed through a sputtering process, a PVD process, or the like. In some embodiments, the seed material layer is constituted by two sub-layers. The first sub-layer may include titanium, titanium nitride, tantalum, tantalum nitride, other suitable materials, or a combination thereof. On the other hand, the second sub-layer may include copper, copper alloys, or other suitable choice of materials. After the seed material layer is conformally formed on the third dielectric layer 170, a patterned photoresist layer (not shown) is formed over the seed material layer. In some embodiments, the patterned photoresist layer is made of a photosensitive material. In some embodiments, the patterned photoresist layer has a plurality of openings that correspond to locations of the conductive structures 200 to be formed. Subsequently, the openings of the patterned photoresist layer are filled with a conductive material. In some embodiments, the conductive material includes copper, copper alloys, or the like. The conductive material is formed by electroplating, deposition, or the like. After the openings are filled with the conductive material, the patterned photoresist layer and the seed material layer underneath the patterned photoresist layer are removed though an ashing or a stripping process, so as to form the conductive structures 200. It should be noted that the steps described above are merely exemplary steps for forming the conductive structures 200, and the disclosure is not limited thereto. In some alternative embodiments, the conductive structures 200 may be formed by pick and place pre-fabricated conductive posts onto the first redistribution structure 100.

In some embodiments, each of the conductive structures 200 includes a seed layer 200a and a conductive layer 200b disposed on the seed layer 200a. For example, the remaining seed material layer described above constitutes the seed layer 200a while the conductive material described above constitutes the conductive layer 200b. In some embodiments, the conductive structures 200 extend into the opening OP4. For example, a portion of each of the conductive structures 200 penetrates through the third dielectric layer 170 to be in physical contact with the connecting patterns 162 and/or the routing patterns 164. That is, the seed layer 200a of the conductive structures 200 is in physical contact with the conductive layer 162b of the connecting patterns 162 and/or the conductive layer 164b of the routing patterns 164 such that the conductive structures 200 are electrically connected to the third conductive layer 160.

In some embodiments, the die 300 is attached to the first redistribution structure 100 through an adhesive layer AD. In some embodiments, the adhesive layer AD includes a die attach film (DAF) or the like. In some embodiments, the die 300 is placed over the first redistribution structure 100 through a pick-and-place process. In some embodiments, the adhesive layer AD is attached to the die 300 prior to the placement of the die 300 onto the first redistribution structure 100. In some embodiments, the die 300 includes a semiconductor substate 310, a plurality of conductive pads 320, a passivation layer 330, a post-passivation layer 340, a plurality of metallic posts 350, and a protection layer 360. In some embodiments, the conductive pads 320 are disposed over the semiconductor substrate 310. The passivation layer 330 is formed over the semiconductor substrate 310 and has contact openings that partially expose the conductive pads 320. The semiconductor substrate 310 may be a silicon substrate including active components (e.g., transistors or the like) and passive components (e.g., resistors, capacitors, inductors, or the like) formed therein. The conductive pads 320 may be aluminum pads, copper pads, or other suitable metal pads. The passivation layer 330 may be a silicon oxide layer, a silicon nitride layer, a silicon oxy-nitride layer, or a dielectric layer formed by other suitable dielectric materials. Furthermore, the post-passivation layer 340 is formed over the passivation layer 330. The post-passivation layer 340 covers the passivation layer 330 and has a plurality of contact openings. The conductive pads 320 are partially exposed by the contact openings of the post-passivation layer 340. The post-passivation layer 340 may be a polyimide layer, a PBO layer, or a dielectric layer formed by other suitable polymers. In addition, the metallic posts 350 are formed on the conductive pads 320. In some embodiments, the metallic posts 350 are plated on the conductive pads 320. The protection layer 360 is formed on the post-passivation layer 340 to cover the metallic posts 350.

As illustrated in FIG. 1H, the die 300 has a rear surface 300a and a front surface 300b opposite to the rear surface 300a. In some embodiments, the rear surface 300a of the die 300 is adhered to the third dielectric layer 170 through the adhesive layer AD. On the other hand, the front surface 300b of the die 300 faces upward and is exposed.

In some embodiments, the formation of the conductive structures 200 may be taken place prior to the placement of the die 300. However, the disclosure is not limited thereto. In some alternative embodiments, the die 300 may be placed onto the first redistribution structure 100 prior to the formation of the conductive structures 200.

In some embodiments, the relative configurations of the elements within the first redistribution structure 100, the conductive structures 200, and the die 300 will be described below in conjunction with FIG. 1H and FIG. 2A to FIG. 2C.

Figure 2A:
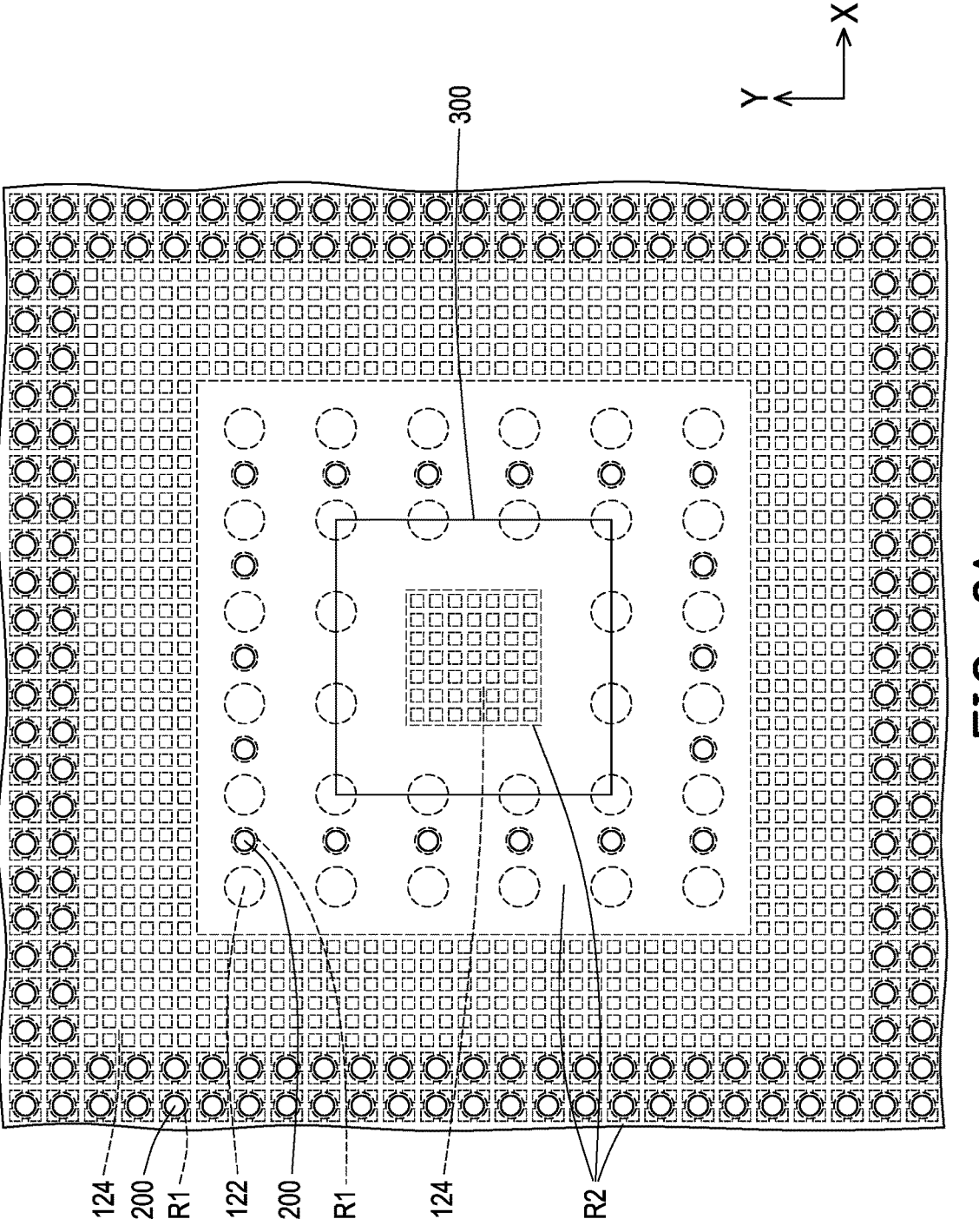
FIG. 2A is a schematic top view of FIG. 1H in accordance with some embodiments of the disclosure.

FIG. 2A is a schematic top view of FIG. 1H in accordance with some embodiments of the disclosure. For simplicity, certain elements (for example, the second conductive layer 140, the third conductive layer 160, the second dielectric layer 150, and the third dielectric layer 170) are omitted in the top view of FIG. 2A. Referring to FIG. 1H and FIG. 2A, the first redistribution structure 100 has a plurality of first regions R1 and a second region R2 surrounding the first region R1. In some embodiments, the first regions R1 correspond to the locations of the conductive structures 200. For example, vertical projections of the conductive structures 200 onto the first redistribution structure 100 fall within the first regions R1 of the first redistribution structure 100. On the other hand, the region of the first redistribution structure 100 other than the first regions R1 is referred to as the second region R2 of the first redistribution structure 100. In some embodiments, the conductive structures 200 are formed on the first regions R1 of the first redistribution structure 100. Meanwhile, the die 300 is placed on the second region R2 of the first redistribution structure 100. In some embodiments, the conductive structures 200 surround the die 300.

As illustrated in FIG. 1H and FIG. 2A, the first regions R1 of the first redistribution structure 100 are free of the first conductive layer 120. That is, the UBM patterns 122 and the dummy patterns 124 are only located in the second region R2 and are not located in the first regions R1. As a result, vertical projections of the conductive structure 200 onto the first redistribution structure 100 are not overlapped with the UBM patterns 122 and the dummy patterns 124. For example, as illustrated in FIG. 2A, each of the conductive structures 200 and each of the UBM patterns 122 have an offset from the top view. Similarly, each of the conductive structures 200 and each of the dummy patterns 124 also have an offset from the top view. In some embodiments, the second conductive layer 140 and the third conductive layer 160 are located in both of the first regions R1 and the second region R2. As illustrated in FIG. 1H, the connecting patterns 142 of the second conductive layer 140 are only located in the second region R2 while the routing patterns 144 of the second conductive layer 140 are located in both of the first regions R1 and the second region R2. In some embodiments, since the connecting patterns 142 are only located in the second region R2, vertical projections of the conductive structure 200 onto the first redistribution structure 100 are not overlapped with the connecting patterns 142. That is, each of the conductive structures 200 and each of the connecting patterns 142 have an offset from the top view.

As illustrated in FIG. 2A, a first group of the conductive structures 200 extend along edges of the subsequently formed integrated fan-out package 10. In some embodiments, the first group of the conductive structures 200 disrupts the mesh structure of the dummy patterns 124. Moreover, as illustrated in FIG. 2A, a second group of the conductive structures 200 is arranged between two mesh structures of the dummy patterns 124. The second group of the conductive structures 200 is arranged in an array along a first direction (i.e. the X-direction) and a second direction (i.e. the Y-direction) perpendicular to the first direction. In some embodiments, each of the conductive structures 200 in the second group and each of the UBM patterns 122 are aligned along the first direction from the top view. However, each of the conductive structures 200 in the second group and each of the UBM patterns 122 have the offset from the top view along the first direction. Meanwhile, each of the conductive structures 200 in the second group and each of the UBM patterns 122 do not have an offset from the top view along the second direction. That is, each of the conductive structures 200 in the second group is located between two adjacent UBM patterns 122 along the first direction.

It should be noted that the arrangement of the UBM patterns 122 with respect to the conductive structures 200 shown in FIG. 2A is merely an exemplary arrangement, and the disclosure is not limited thereto. In some alternative embodiments, the UBM patterns 122 and the conductive structures 200 may be arranged differently, as shown in FIG. 2B and FIG. 2C.

Figure 2B:
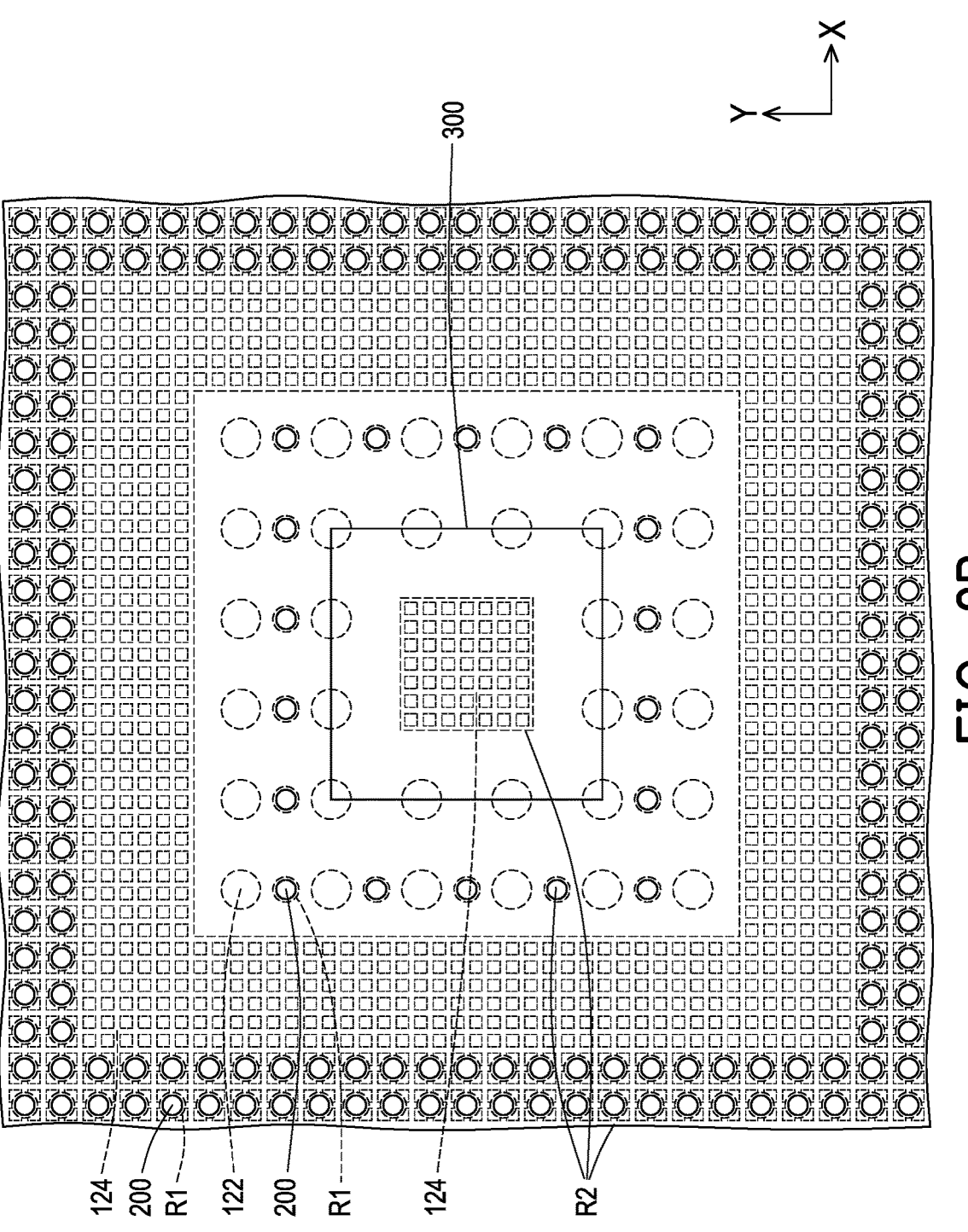
FIG. 2B is a schematic top view of FIG. 1H in accordance with some alternative embodiments of the disclosure.

FIG. 2B is a schematic top view of FIG. 1H in accordance with some alternative embodiments of the disclosure. For simplicity, certain elements (for example, the second conductive layer 140, the third conductive layer 160, the second dielectric layer 150, and the third dielectric layer 170) are omitted in the top view of FIG. 2B. Referring to FIG. 2B, the top view shown in FIG. 2B is similar to the top view shown in FIG. 2A, so similar elements are denoted by the same reference numeral and the detailed descriptions thereof are omitted herein. The difference between the top view shown in FIG. 2B and the top view shown in FIG. 2A lies in that the locations of the second group of the conductive structures 200 in FIG. 2B are altered. As illustrated in FIG. 2B, the second group of the conductive structures 200 is arranged in an array along a first direction (i.e. the X-direction) and a second direction (i.e. the Y-direction) perpendicular to the first direction. In some embodiments, each of the conductive structures 200 in the second group and each of the UBM patterns 122 are aligned along the second direction from the top view. However, each of the conductive structures 200 in the second group and each of the UBM patterns 122 have the offset from the top view along the second direction. Meanwhile, each of the conductive structures 200 in the second group and each of the UBM patterns 122 do not have an offset from the top view along the first direction. That is, each of the conductive structures 200 in the second group is located between two adjacent UBM patterns 122 along the second direction.

Figure 2C:
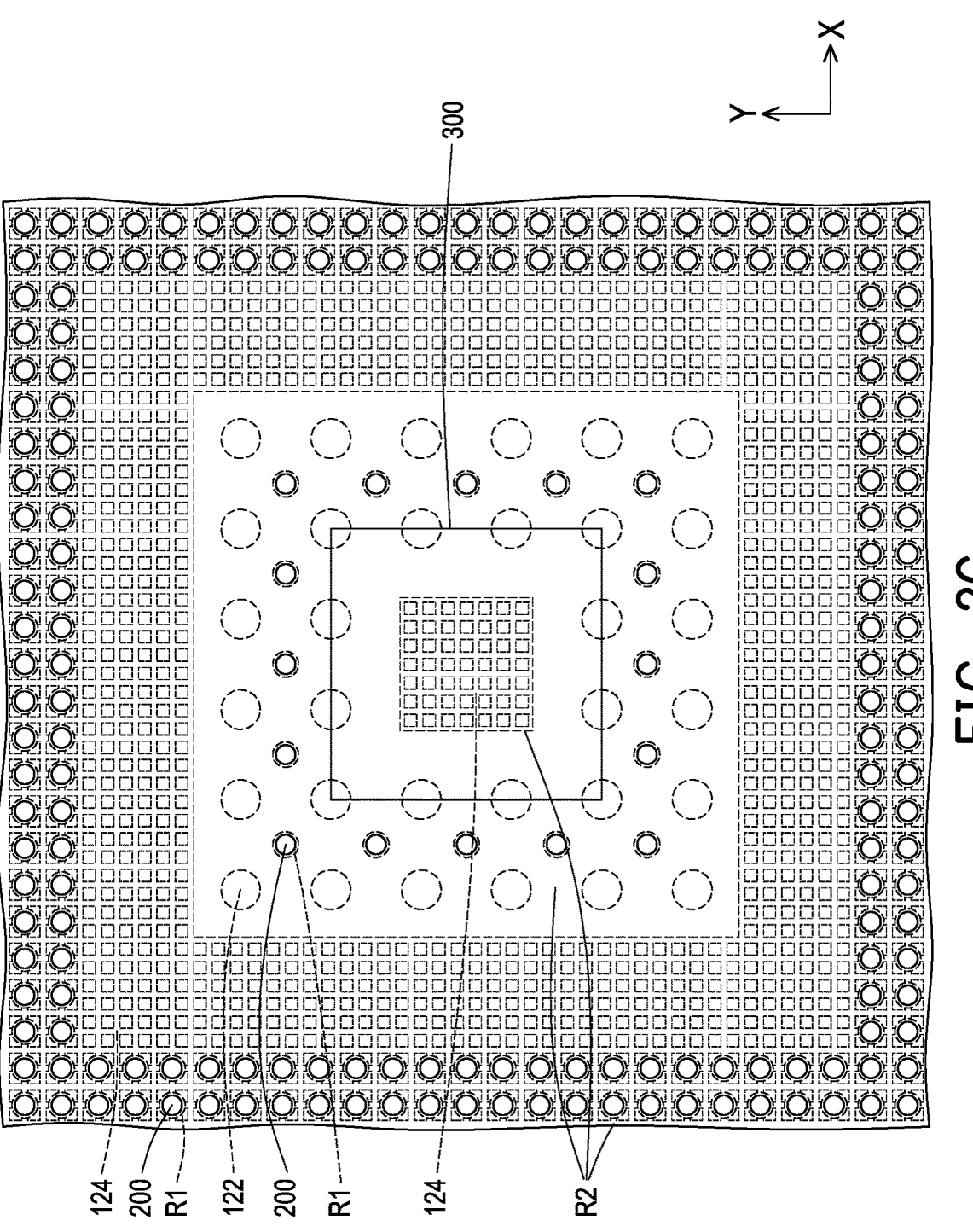
FIG. 2C is a schematic top view of FIG. 1H in accordance with some alternative embodiments of the disclosure.

FIG. 2C is a schematic top view of FIG. 1H in accordance with some alternative embodiments of the disclosure. For simplicity, certain elements (for example, the second conductive layer 140, the third conductive layer 160, the second dielectric layer 150, and the third dielectric layer 170) are omitted in the top view of FIG. 2C. Referring to FIG. 2C, the top view shown in FIG. 2C is similar to the top view shown in FIG. 2A, so similar elements are denoted by the same reference numeral and the detailed descriptions thereof are omitted herein. The difference between the top view shown in FIG. 2C and the top view shown in FIG. 2A lies in that the locations of the second group of the conductive structures 200 in FIG. 2C are altered. As illustrated in FIG. 2C, the second group of the conductive structures 200 is arranged in an array along a first direction (i.e. the X-direction) and a second direction (i.e. the Y-direction) perpendicular to the first direction. In some embodiments, each of the conductive structures 200 in the second group and each of the UBM patterns 122 have the offset from the top view along both the first direction and the second direction. That is, each of the conductive structures 200 in the second group and each of the UBM patterns 122 are arranged in a staggered manner.

As illustrated in FIG. 1H and FIG. 2A to FIG. 2C, since the UBM patterns 122 and the dummy patterns 124 are only located in the second region R2 and are not located in the first regions R1, a metal density in the first regions R1 of the first redistribution structure 100 is smaller than a metal density in the second region R2 of the first redistribution structure 100. Meanwhile, a dielectric density in the first regions R1 of the first redistribution structure 100 is larger than a dielectric density in the second region R2 of the first redistribution structure 100. Throughout the disclosure, the metal density is referred to as a volume of metal material within a unit volume. For example, within the same volume, the amount of metal material in the first regions R1 of the first redistribution structure 100 is less than the amount of metal material in the second region R2 of the first redistribution structure 100. In addition, throughout the disclosure, the dielectric density is referred to as a volume of dielectric material within a unit volume. For example, within the same volume, the amount of dielectric material in the first regions R1 of the first redistribution structure 100 is greater than the amount of dielectric material in the second region R2 of the first redistribution structure 100. Since less metal material is provided directly underneath the conductive structures 200, the stress derived from coefficient of thermal expansion (CTE) mismatch between elements in the subsequently formed integrated fan-out package 10 during fabrication process thereof may be sufficiently reduced. As a result, the delamination between elements in the subsequently formed integrated fan-out package 10 may be alleviated and the quality of the subsequently formed integrated fan-out package 10 may be ensured.

Figure 1I:
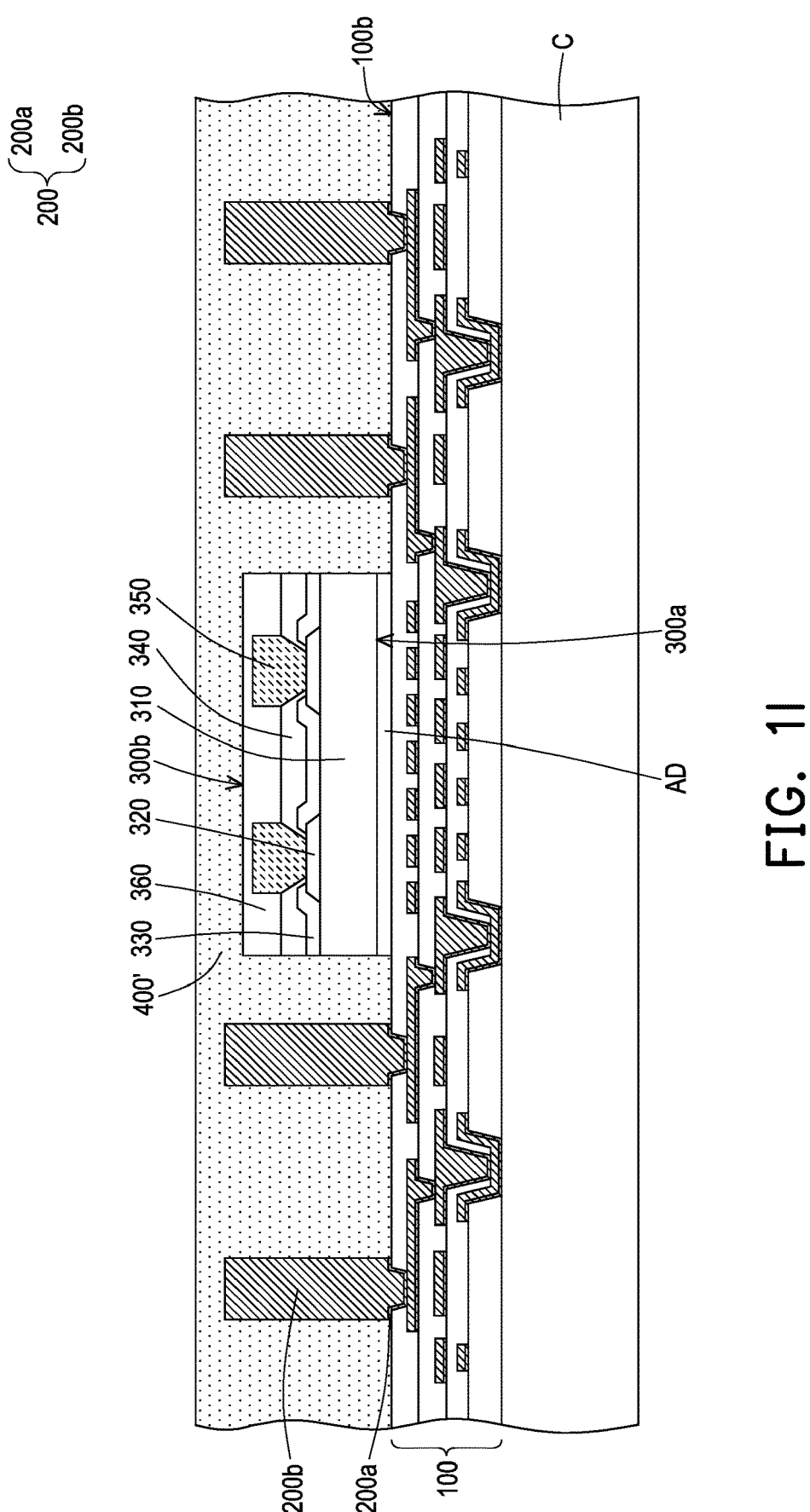

Referring to FIG. 1I, an encapsulation material 400' is formed on the second surface 100$b$ of the first redistribution structure 100 to encapsulate the conductive structures 200, the die 300, and the adhesive layer AD. In some embodiments, the conductive structures 200 and the protection layer 360 of the die 300 are encapsulated by the encapsulation material 400'. In other words, the conductive structures 200 and the protection layer 360 of the die 300 are not revealed and are well protected by the encapsulation material 400'. In some embodiments, the encapsulation material 400' includes a molding compound, a molding underfill, a resin (such as epoxy), or the like. The encapsulation material 400' may be formed by a molding process, such as a compression molding process.

Figure 1J:
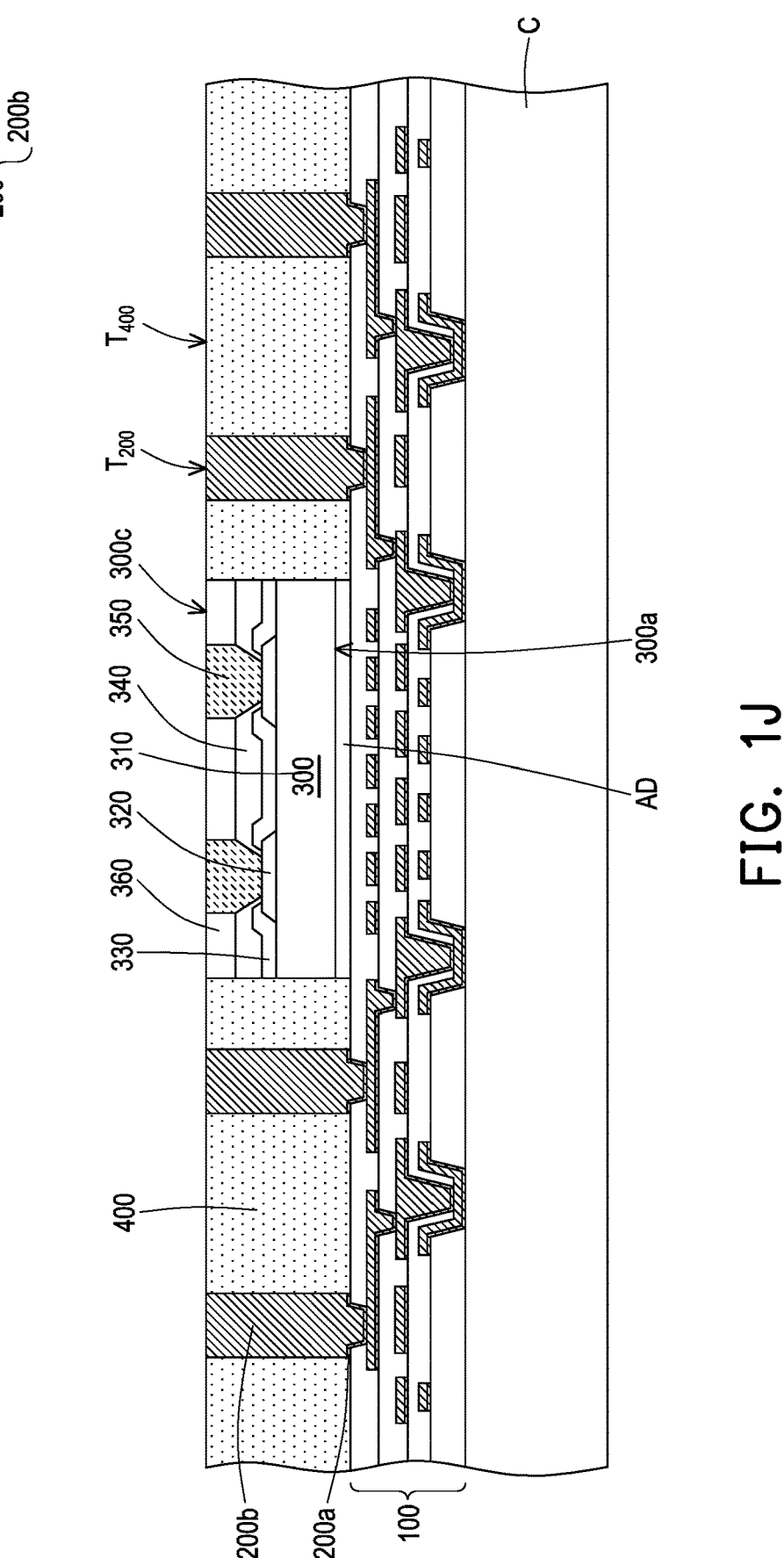

Referring to FIG. 1I and FIG. 1J, the encapsulation material 400' and the protection layer 360 of the die 300 are grinded until top surfaces of the metallic posts 350 are exposed. After the encapsulation material 400' is grinded, an encapsulant 400 is formed over the second surface 100$b$ of the first redistribution structure 100 to laterally encapsulate the conductive structures 200, the die 300, and the adhesive layer AD. In some embodiments, the encapsulant material 400' is grinded by a mechanical grinding process and/or a chemical mechanical polishing (CMP) process. In some embodiments, during the grinding process of the encapsulant material 400', the protection layer 360 is grinded to reveal the metallic posts 350. In some embodiments, portions of the metallic posts 350 and portions of the conductive structures 200 are slightly grinded as well. After grinding, the die 300 has an active surface 300$c$ and a rear surface 300$a$ opposite to the active surface 300$c$. The exposed portion of the metallic posts 350 is located on the active surface 300$c$ of the die 300. In some embodiments, the encapsulant 400 encapsulates sidewalls of the conductive structures 200, sidewalls of the die 300, and sidewalls of the adhesive layer AD. In some embodiments, the encapsulant 400 is penetrated by the conductive structures 200. As shown in FIG. 1J, top surfaces $T_{200}$ of the conductive structures 200, the active surface 300$c$ of the die 300, and a top surface $T_{400}$ of the encapsulant 400 are substantially coplanar.

Figure 1K:
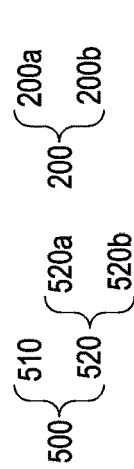

Referring to FIG. 1K, a second redistribution structure 500 is formed on the conductive structure 200, the die 300, and the encapsulant 400. In some embodiments, the second redistribution structure 500 includes a plurality of dielectric layers 510 and a plurality of conductive patters 520. In some embodiments, a material and a formation method of the dielectric layers 510 are similar to the material and the formation method of the marking layer 110, the first dielectric layer 130, the second dielectric layer 150, and the third dielectric layer 170, so the descriptions thereof are omitted herein. In some embodiments, each conductive pattern 520 includes a seed layer 520$a$ and a conductive layer 520$b$ disposed on the seed layer 520$a$. In some embodiments, a material and a formation method of the conductive patterns 520 are similar to the material and the formation method of the first conductive layer 120, the second conductive layer 140, and the third conductive layer 160, so the detailed descriptions therefore are omitted herein.

As illustrated in FIG. 1K, the dielectric layer 510 and the conductive patterns 520 are stacked alternately. In some embodiments, some of the conductive patterns 520 penetrate through the underlying dielectric layer 510 to render electrical connection between conductive patterns 520 located at different level heights. In some embodiments, the bottommost conductive patterns 520 penetrate through the bottommost dielectric layer 510 to be in physical contact with the metallic posts 350 of the die 300 and the conductive structures 200, so as to electrically connect the second redistribution structure 500 with the conductive structures 200 and the die 300.

Figure 1L:
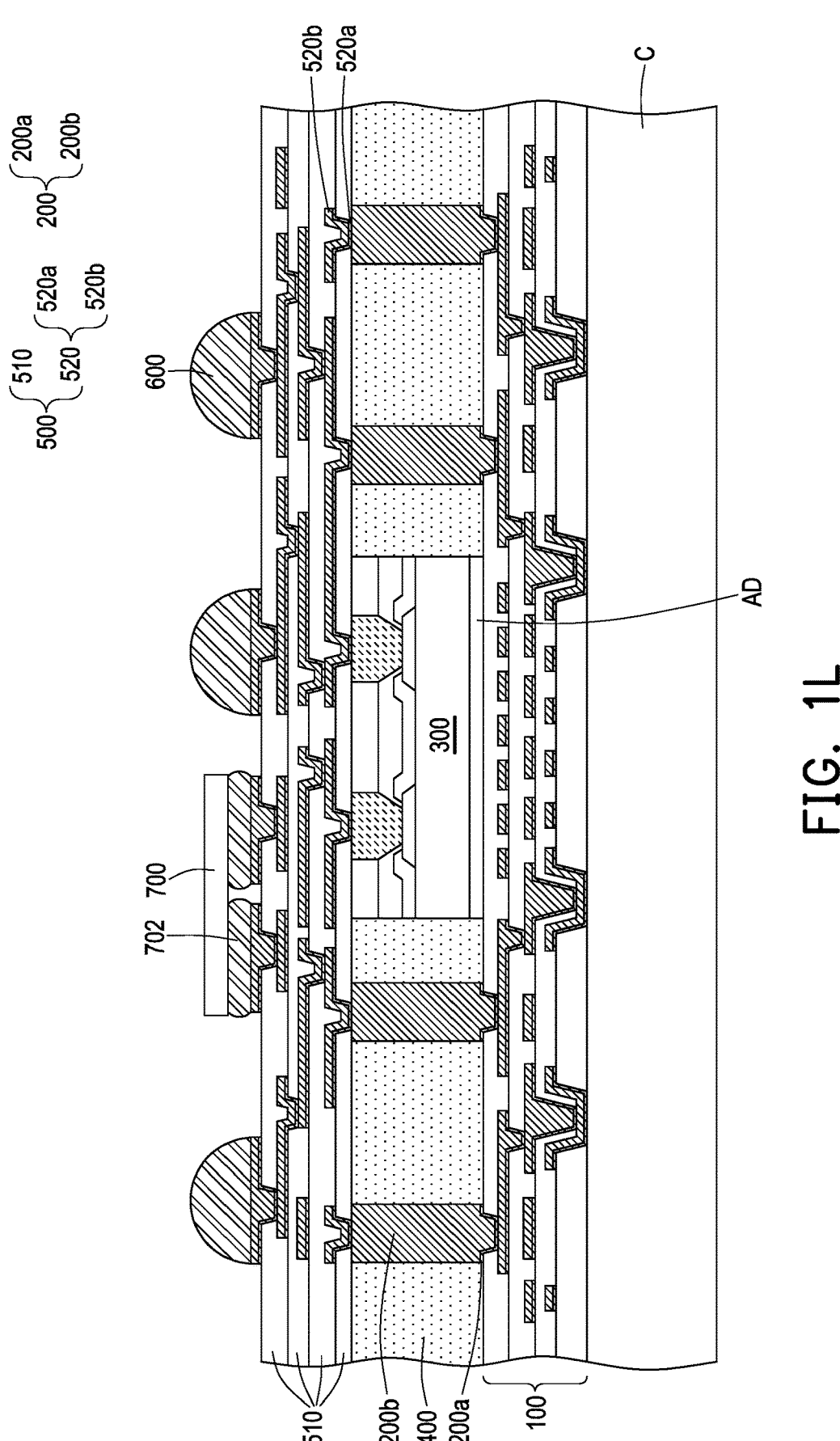

Referring to FIG. 1L, a plurality of conductive terminals 600 and a passive component 700 are formed on the second redistribution structure 500. For example, the conductive terminals 600 and the passive component 700 are electrically connected to the second redistribution structure 500. In some embodiments, the conductive terminals 600 include solder balls, ball grid array (BGA) balls, or the like. In some embodiments, the conductive terminals 600 are made of a conductive material with low resistivity, such as Sn, Pb, Ag, Cu, Ni, Bi, or an alloy thereof. In some embodiments, the conductive terminals 600 are attached to some of the topmost conductive patterns 520. For example, the conductive terminals 600 may be placed on these topmost conductive patterns 520 through a ball placement process. Thereafter, a reflow process is performed to securely fix the conductive terminals 600 on these topmost conductive patterns 520.

In some embodiments, the passive component 700 includes capacitors, resistors, inductors, antennas, the like, or a combination thereof. In some embodiments, the passive component 700 is mounted to some of the topmost conductive patterns 520. For example, the passive component 700 may be mounted on these topmost conductive patterns 520 through conductive joints 702. In some embodiments, the conductive joints 702 include solder joints, BGA joints, or the like. In some embodiments, the conductive joints 702 are made of a conductive material with low resistivity, such as Sn, Pb, Ag, Cu, Ni, Bi, or an alloy thereof. After the passive component 700 is mounted to some of the topmost conductive patterns 520, a reflow process is performed to securely fix the passive component 700 on these topmost conductive patterns 520.

Figure 1M:
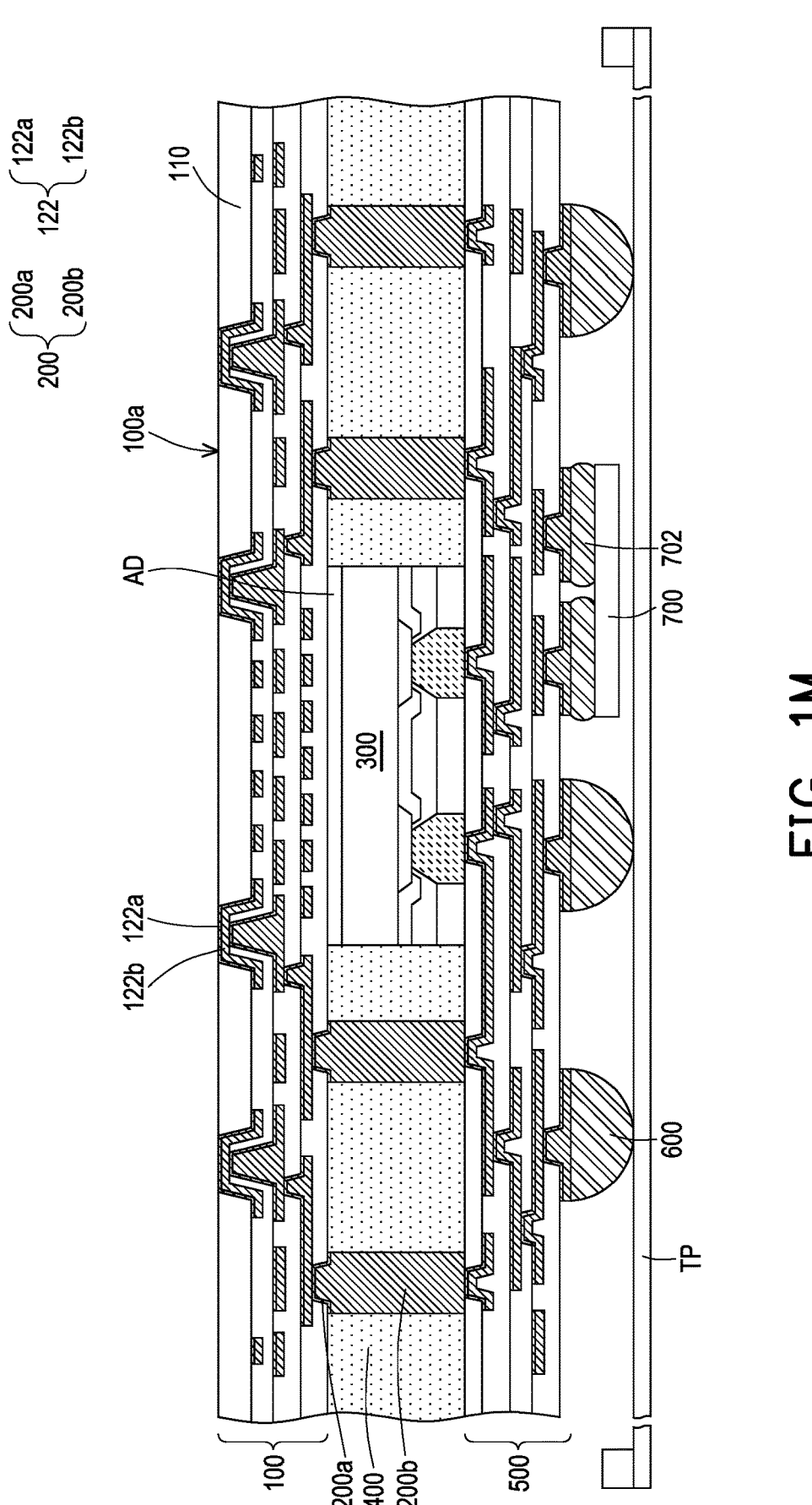

Referring to FIG. 1L and FIG. 1M, the structure illustrated in FIG. 1L is flipped upside down and is placed on a dicing tape TP. Thereafter, the carrier C is removed to expose the first surface 100$a$ of the first redistribution structure 100. In other words, the seed layer 122$a$ of each UBM pattern 122 is exposed at the first surface 100$a$ of the first redistribution structure 100. In some embodiments, the carrier C is removed by a suitable process, such as etching, grinding, mechanical peeling-off, or the like. In an embodiment where the adhesive layer (e.g., the LTHC film) is formed on the carrier C, the carrier C is de-bonded by exposing to a laser or UV light. The laser or UV light breaks the chemical bonds of the adhesive layer that binds to the carrier C, and the carrier C may then be de-bonded. Residues of the adhesive layer, if any, may be removed by a cleaning process performed after the carrier de-bonding process.

Figure 1N:
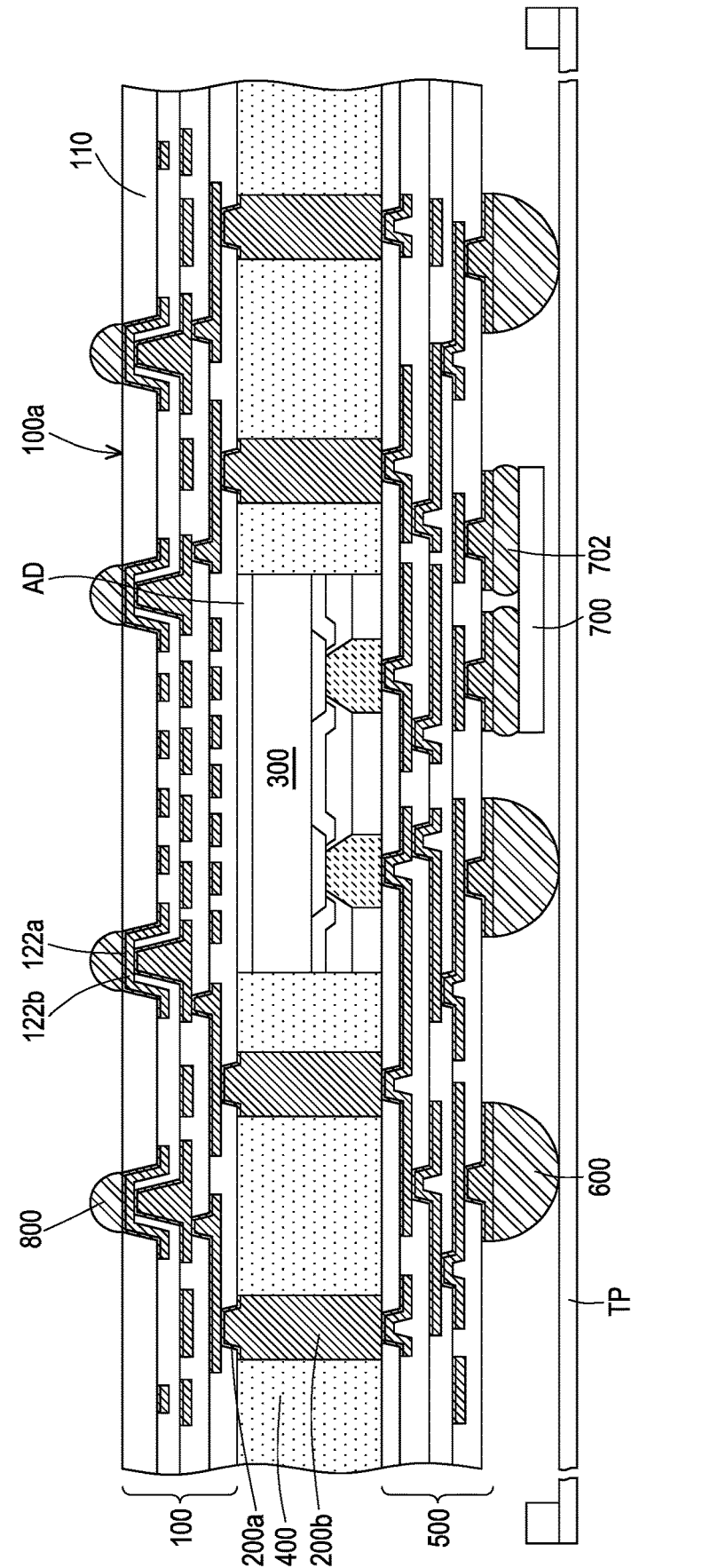
Figure 10:
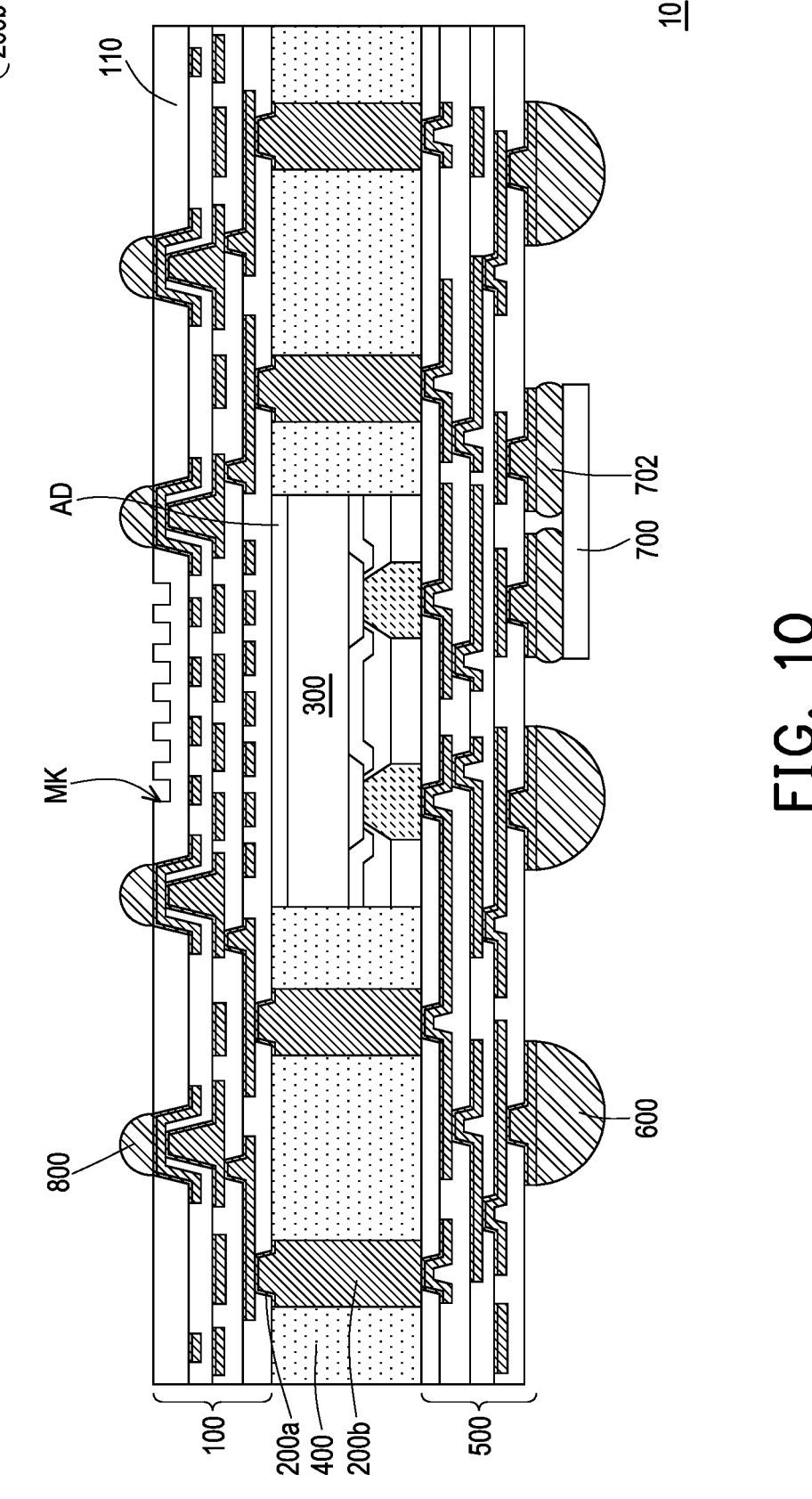

Referring to FIG. 1N, a plurality of conductive terminals 800 is formed on the first surface 100a of the first redistribution structure 100. For example, the conductive terminals 800 are disposed on the UBM patterns 122. In some embodiments, the conductive terminals 800 include solder balls, BGA balls, or the like. In some embodiments, the conductive terminals 800 are made of a conductive material with low resistivity, such as Sn, Pb, Ag, Cu, Ni, Bi, or an alloy thereof. In some embodiments, the conductive terminals 800 are attached to the seed layer 122a of each UBM pattern 122. For example, the conductive terminals 800 may be placed on the UBM patterns 122 through a ball placement process. Thereafter, a reflow process is performed to securely fix the conductive terminals 800 on the UBM patterns 122.

Referring to FIG. 1O, a labelling process is performed on the marking layer 110 of the first redistribution structure 100 to render a plurality of marking patterns MK. In some embodiments, the labelling process is performed by laser marking or the like. In some embodiments, the marking patterns MK include product information, product label, or the like. In some embodiments, the previous processes are performed at wafer level, and a singulation process may be performed after the labelling process is completed. In some embodiments, the singulation process typically involves dicing with a rotation blade and/or a laser beam. In other words, the singulation process includes a laser cutting process, a mechanical cutting process, a laser grooving process, other suitable processes, or a combination thereof. For example, a laser grooving process may be performed on the unsingulated structure to form trenches (not shown) in the said structure. Thereafter, a mechanical cutting process may be performed on the locations of the trenches to cut through the said structure, so as to obtain a plurality of integrated fan-out packages 10 shown in FIG. 1O.

Figure 3:
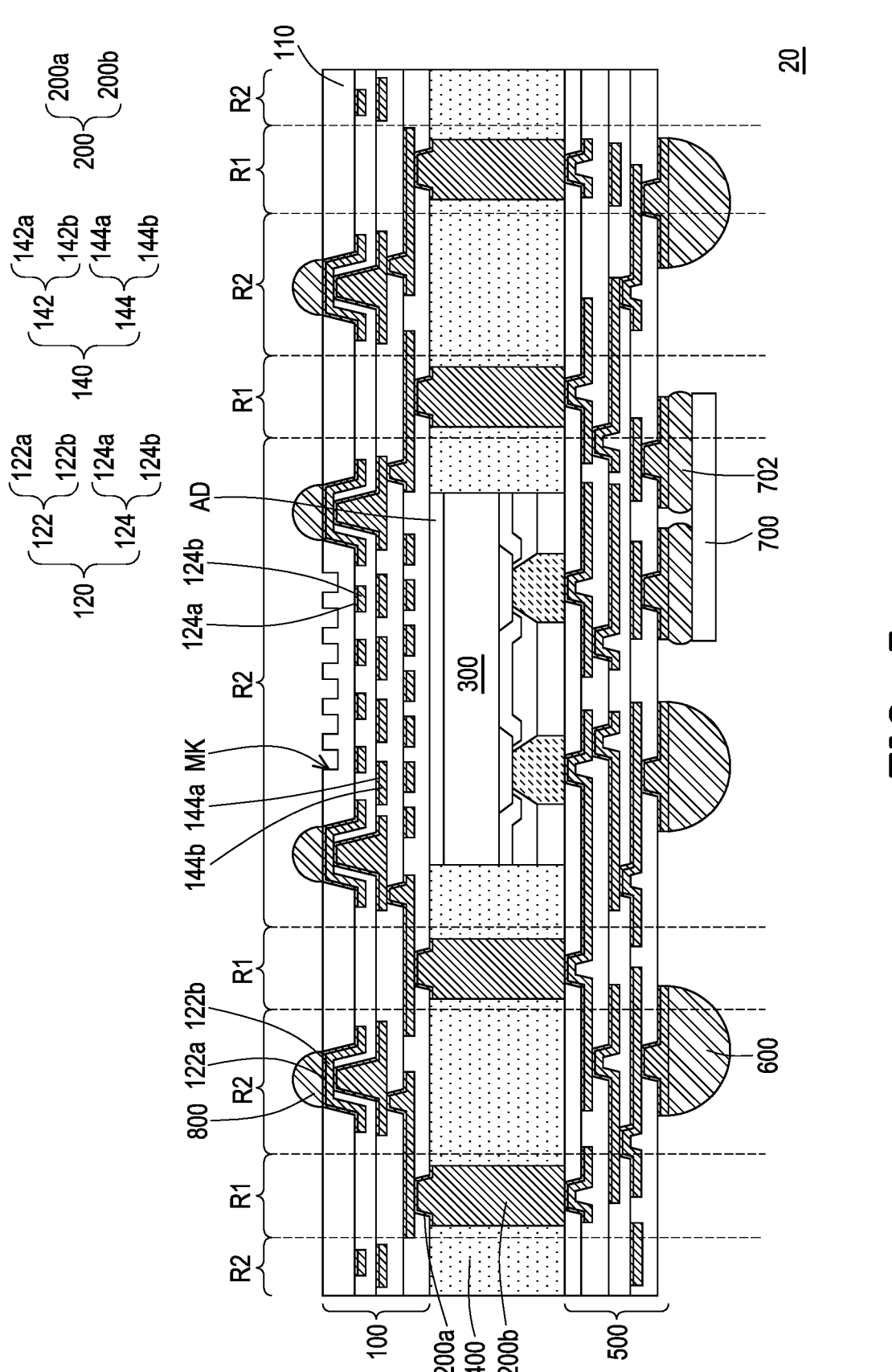
FIG. 3 is a schematic cross-sectional view illustrating an integrated fan-out package in accordance with some alternative embodiments of the disclosure.

FIG. 3 is a schematic cross-sectional view illustrating an integrated fan-out package 20 in accordance with some alternative embodiments of the disclosure. Referring to FIG. 3, the integrated fan-out package 20 in FIG. 3 is similar to the integrated fan-out package 10 in FIG. 1O, so similar elements are denoted by the same reference numeral and the detailed description thereof is omitted herein. The difference between the integrated fan-out package 20 in FIG. 3 and the integrated fan-out package 10 in FIG. 1O lies in that in the integrated fan-out package 20, the first regions R1 of the first redistribution structure 100 are free of both of the first conductive layer 120 and the second conductive layer 140. That is, the UBM patterns 122, the dummy patterns 124, the connecting patterns 142, and the routing patterns 144 are only located in the second region R2 and are not located in the first regions R1. As a result, vertical projections of the conductive structure 200 onto the first redistribution structure 100 are not overlapped with the UBM patterns 122, the dummy patterns 124, the connecting patterns 142, and the routing patterns 144. For example, each of the conductive structures 200 and each of the UBM patterns 122 have an offset from a top view, each of the conductive structures 200 and each of the connecting patterns 142 have an offset from the top view, each of the conductive structures 200 and each of the dummy patterns 124 have an offset from the top view, and each of the conductive structures 200 and each of the routing patterns 144 have an offset from the top view.

As illustrated in FIG. 3, since the UBM patterns 122, the dummy patterns 124, the connecting patterns 142, and the routing patterns 144 are only located in the second region R2 and are not located in the first regions R1, a metal density in the first regions R1 of the first redistribution structure 100 is smaller than a metal density in the second region R2 of the first redistribution structure 100. Meanwhile, a dielectric density in the first regions R1 of the first redistribution structure 100 is larger than a dielectric density in the second region R2 of the first redistribution structure 100. Since less metal material is provided directly underneath the conductive structures 200, the stress derived from CTE mismatch between elements in the integrated fan-out package 20 during fabrication process thereof may be sufficiently reduced. As a result, the delamination between elements in the integrated fan-out package 20 may be alleviated and the quality of the integrated fan-out package 20 may be ensured.

In accordance with some embodiments of the disclosure, an integrated fan-out package includes a first redistribution structure, a die, conductive structures, an encapsulant, and a second redistribution structure. The first redistribution structure has first regions and a second region surrounding the first regions. A metal density in the first regions is smaller than a metal density in the second region. The die is disposed over the first redistribution structure. The conductive structures are disposed on the first redistribution structure to surround the die. Vertical projections of the conductive structures onto the first redistribution structure fall within the first regions of the first redistribution structure. The encapsulant encapsulates the die and the conductive structures. The second redistribution structure is disposed on the encapsulant, the die, and the conductive structures.

In accordance with some alternative embodiments of the disclosure, an integrated fan-out package includes a first redistribution structure, a die, conductive structures, an encapsulant, and a second redistribution structure. The first redistribution structure has a first surface and a second surface opposite to the first surface. The first redistribution structure includes under-ball metallurgy (UBM) patterns at the first surface. The die is disposed over the second surface of the first redistribution structure. The conductive structures are disposed on the second surface of the first redistribution structure. Each of the conductive structures and each of the UBM patterns have an offset from a top view. The encapsulant encapsulates the die and the conductive structures. The second redistribution structure is disposed on the encapsulant, the die, and the conductive structures.

In accordance with some embodiments of the disclosure, a manufacturing method of an integrated fan-out package includes at least the following steps. A carrier is provided. A first redistribution structure is formed on the carrier. The first redistribution structure has first regions and a second region surrounding the first regions. A metal density in the first regions is smaller than a metal density in the second region. Conductive structures are formed on the first regions of the first redistribution structure. A die is placed on the second region of the first redistribution structure such that the conductive structures surround the die. The die and the conductive structures are laterally encapsulated by an encapsulant. A second redistribution structure is formed on the encapsulant, the die, and the conductive structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated fan-out package, comprising:
a first redistribution structure having first regions and a second region surrounding the first regions, wherein a metal density in the first regions is smaller than a metal density in the second region;
a die disposed over the first redistribution structure, wherein the die has an active surface facing away from the first redistribution structure;
conductive structures disposed on the first redistribution structure to surround the die, wherein vertical projections of the conductive structures onto the first redistribution structure fall within the first regions of the first redistribution structure;
an encapsulant encapsulating the die and the conductive structures; and
a second redistribution structure disposed on the encapsulant, the die, and the conductive structures.

2. The integrated fan-out package of claim 1, wherein the first redistribution structure comprises:
a marking layer;
a first conductive layer disposed on the marking layer;
a first dielectric layer disposed on the marking layer and the first conductive layer;
a second conductive layer disposed on the first dielectric layer, wherein the second conductive layer is electrically connected to the first conductive layer;
a second dielectric layer disposed on the first dielectric layer and the second conductive layer; and
a third conductive layer disposed on the second dielectric layer, wherein the third conductive layer is electrically connected to the second conductive layer and the conductive structures.

3. The integrated fan-out package of claim 2, wherein first regions of the first redistribution structure are free of the first conductive layer.

4. The integrated fan-out package of claim 3, wherein first regions of the first redistribution structure are free of the second conductive layer.

5. The integrated fan-out package of claim 2, wherein first conductive layer comprises under-ball metallurgy (UBM) patterns and dummy patterns, the UBM patterns penetrate through the marking layer, and the UBM patterns are located in the second region of the first redistribution structure.

6. The integrated fan-out package of claim 5, further comprising conductive terminals disposed on the UBM patterns.

7. The integrated fan-out package of claim 5, wherein the dummy patterns are electrically floating.

8. The integrated fan-out package of claim 5, wherein dummy patterns are located in the second region.

9. The integrated fan-out package of claim 2, wherein the second conductive layer comprises connecting patterns and routing patterns located in the second region, and the connecting patterns penetrate through the first dielectric layer to be in physical contact with the UBM patterns.

10. An integrated fan-out package, comprising:
a first redistribution structure having a first surface and a second surface opposite to the first surface, wherein the first redistribution structure comprises under-ball metallurgy (UBM) patterns at the first surface;
a die disposed over the second surface of the first redistribution structure, wherein the die has an active surface facing away from the first redistribution structure;
conductive structures disposed on the second surface of the first redistribution structure, wherein each of the conductive structures and each of the UBM patterns have an offset from a top view;
an encapsulant encapsulating the die and the conductive structures; and
a second redistribution structure disposed on the encapsulant, the die, and the conductive structures.

11. The integrated fan-out package of claim 10, wherein the conductive structures are arranged in an array along a first direction and a second direction perpendicular to the first direction, and each of the conductive structures and each of the UBM patterns have the offset from the top view along the first direction.

12. The integrated fan-out package of claim 11, wherein each of the conductive structures and each of the UBM patterns further have the offset from the top view along the second direction.

13. The integrated fan-out package of claim 10, wherein the first redistribution structure comprises:
a marking layer;
a first conductive layer disposed on the marking layer, wherein the first conductive layer comprises the UBM patterns and dummy patterns;
a first dielectric layer disposed on the marking layer and the first conductive layer;
a second conductive layer disposed on the first dielectric layer, wherein the second conductive layer is electrically connected to the first conductive layer;
a second dielectric layer disposed on the first dielectric layer and the second conductive layer; and
a third conductive layer disposed on the second dielectric layer, wherein the third conductive layer is electrically connected to the second conductive layer and the conductive structures.

14. The integrated fan-out package of claim 13, wherein each of the conductive structures and each of the dummy patterns have an offset from the top view.

15. The integrated fan-out package of claim 13, wherein the dummy patterns and a portion of each of the UBM patterns are located at a same level height.

16. The integrated fan-out package of claim 13, wherein the second conductive layer comprises connecting patterns penetrating through the first dielectric layer to be in physical contact with the UBM patterns, and each of the conductive structures and each of the connecting patterns have an offset from the top view.

17. A manufacturing method of an integrated fan-out package, comprising:
providing a carrier;
forming a first redistribution structure on the carrier, wherein the first redistribution structure has first regions and a second region surrounding the first regions, and a metal density in the first regions is smaller than a metal density in the second region;
forming conductive structures on the first regions of the first redistribution structure such that vertical projections of the conductive structures onto the first redistribution structure fall within the first regions of the first redistribution structure;

placing a die on the second region of the first redistribution structure such that the conductive structures surround the die, wherein the die has an active surface facing away from the first redistribution structure;

laterally encapsulating the die and the conductive structures by an encapsulant; and forming a second redistribution structure on the encapsulant, the die, and the conductive structures.

18. The method of claim 17, wherein forming the first redistribution structure comprises:

forming a marking layer on the carrier;

forming first openings in the marking layer; and forming under-ball metallurgy (UBM) patterns and dummy patterns on the marking layer, wherein the UBM patterns extend into the first openings, and the UBM patterns and the dummy patterns are located in the second region.

19. The method of claim 18, wherein forming the first redistribution structure further comprises:

forming a first dielectric layer on the marking layer, the UBM patterns, and the dummy patterns;

forming second openings in the first dielectric layer to partially expose the UBM patterns; and forming connecting patterns and routing patterns on the second dielectric layer, wherein the connecting patterns extend into the second openings to be in physical contact with the UBM patterns, and the connecting patterns are located in the second region.

20. The method of claim 19, wherein the routing patterns are located in the second region.

* * * * *